(12) United States Patent
Rozbicki et al.

(10) Patent No.: US 6,642,146 B1
(45) Date of Patent: Nov. 4, 2003

(54) METHOD OF DEPOSITING COPPER SEED ON SEMICONDUCTOR SUBSTRATES

(75) Inventors: Robert Rozbicki, San Francisco, CA (US); Michal Danek, Cupertino, CA (US); Erich Klawuhn, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/121,949

(22) Filed: Apr. 10, 2002

Related U.S. Application Data

(63) Continuation-in-part of application No. 09/965,472, filed on Sep. 26, 2001
(60) Provisional application No. 60/275,803, filed on Mar. 13, 2001.

(51) Int. Cl.⁷ .................................. H01L 21/44
(52) U.S. Cl. .................. 438/687; 438/622; 438/624; 438/625; 438/627; 438/628; 438/629; 438/637; 438/638; 438/644; 438/648; 438/654; 438/656; 438/666; 438/668; 438/672; 438/675; 438/678; 438/685
(58) Field of Search ................ 438/622, 624–625, 438/627–629, 637–638, 644, 648, 654, 656, 666, 668, 672, 675, 678, 685, 687

(56) References Cited

U.S. PATENT DOCUMENTS

| | | |
|---|---|---|
| 5,221,449 A | 6/1993 | Colgan et al. |
| 5,281,485 A | 1/1994 | Colgan et al. |
| 5,482,611 A | 1/1996 | Helmer et al. |
| 5,985,762 A | 11/1999 | Geffken et al. |
| 6,074,544 A | 6/2000 | Reid et al. |
| 6,080,285 A | 6/2000 | Liu et al. |
| 6,099,702 A | 8/2000 | Reid et al. |
| 6,110,346 A | 8/2000 | Reid et al. |
| 6,124,203 A | 9/2000 | Joo et al. |
| 6,126,798 A | 10/2000 | Reid et al. |
| 6,139,712 A | 10/2000 | Patton et al. |
| 6,156,167 A | 12/2000 | Patton et al. |
| 6,159,354 A | 12/2000 | Contolini et al. |
| 6,162,344 A | 12/2000 | Reid et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,217,716 B1 | 4/2001 | Fai Lai |
| 6,221,757 B1 | 4/2001 | Schmidbauer et al. |
| 6,228,754 B1 | 5/2001 | Iacoponi et al. |
| 6,251,242 B1 | 6/2001 | Fu et al. |
| 6,274,008 B1 | 8/2001 | Gopalraja et al. |
| 6,277,249 B1 | 8/2001 | Gopalraja et al. |
| 6,287,977 B1 | 9/2001 | Hashim et al. |
| 2002/0041028 A1 * | 4/2002 | Choi et al. ............ 438/627 |

OTHER PUBLICATIONS

Rozbicki et al., "Method of Depositing a Diffusion Barrier for Copper Interconnect," Application No. 09/965,472, Filed Sep. 26, 2001, 38 Pages.

* cited by examiner

Primary Examiner—John F. Niebling
Assistant Examiner—Lynne Gurley
(74) Attorney, Agent, or Firm—Beyer Weaver & Thomas, LLP

(57) ABSTRACT

The present invention pertains to methods for depositing a metal seed layer on a wafer substrate having a plurality of recessed features. Methods of the invention include at least two operations. A first portion of a seed layer is deposited such that metal ions impinge on the wafer substrate substantially perpendicular to the wafer substrate work surface. The first portion is characterized by heavy bottom coverage in the recessed features and minimal overhang on the apertures of the recessed features. A second portion of the metal seed layer is deposited with simultaneous re-sputter of at least part of the first portion that covers the bottom of the features. During re-sputter, part of the seed material on the bottom is redistributed to the sidewalls of the features. Seed layers of the invention have minimal overhang and excellent step coverage.

40 Claims, 13 Drawing Sheets

METHOD OF DEPOSITING COPPER SEED ON SEMICONDUCTOR SUBSTRATES

CROSS-REFERENCE TO RELATED APPLICATIONS

This application is a continuation-in-part claiming priority under 35 USC 120 from U.S. patent application Ser. No. 09/965,472 naming Rozbicki et al. as inventors, entitled "Method of Depositing Diffusions Barriers for Copper Interconnect Applications," filed Sep. 26, 2001, which in turn claims priority under 35 USC 119(e) from U.S. Provisional Application No. 60/275,803 naming Rozbicki et al. as inventors, entitled "Method of Depositing Barrier-Seed Layer on Semiconductor Substrates," filed Mar. 13, 2001, both of which are incorporated herein by reference in their entirety for all purposes. This patent application is related to U.S. patent application Ser. No. 09/776,702, entitled "Anti-Agglomeration of Copper in Integrated Circuit Metalization" filed by Rozbicki on Feb. 2, 2001, U.S. patent application Ser. No. 09/862,539, entitled "Improved Deposition of Conformal Copper Seed Layers by Control of Barrier Layer Morphology" filed by Suwwan de Felipe on May 21, 2001, and U.S. patent application Ser. No. 09/965,471, entitled "Method of Depositing a Diffusion Barrier for Copper Interconnection Applications" filed by Suwwan de Felipe on the same date as this application. These patent applications, along with all other patent applications, patents and publications mentioned herein are incorporated by reference in their entirety for all purposes.

FIELD OF THE INVENTION

The present invention pertains to methods for forming a seed layer on an integrated circuit. More specifically, the methods include at least two operations. The first operation deposits seed material via PVD to provide some coverage, minimizing formation of overhang at feature openings. The second operation redistributes a portion of the seed material deposited in the first operation onto the sidewalls of the features, while simultaneously depositing additional material at least to the upper sidewalls.

BACKGROUND OF THE INVENTION

Integrated circuit (IC) manufacturers have traditionally used aluminum and aluminum alloys, among other metals, as the conductive metal for integrated circuits. While copper has a greater conductivity than aluminum, it has not been used because of certain challenges it presents, including the fact that it readily diffuses into silicon oxide and degrades insulating electrical properties even at very low concentrations. Recently, however, IC manufacturers have been turning to copper because of its high conductivity and electromigration resistance, among other desirable properties. Most notable among the IC metalization processes that use copper is Damascene processing. Damascene processing is often a preferred method because it requires fewer processing steps than other methods and offers a higher yield. It is also particularly well-suited to metals such as Cu that cannot readily be patterned by plasma etching.

Damascene processing is a method for forming metal lines on integrated circuits. It involves formation of inlaid metal lines in trenches and vias formed in a dielectric layer. (inter-metal dielectric). Damascene processing is often a preferred method because it requires fewer processing steps than other methods and offers a higher yield. It is also particularly well-suited to metals such as Cu that cannot readily be patterned by plasma etching. In order to frame the context of this invention, a brief description of a copper dual Damascene process for forming a partially fabricated integrated circuit is described below.

Presented in FIGS. 1A–1H, is a cross sectional depiction of a dual Damascene fabrication process. Referring to FIG. 1A, an example of a typical substrate, 100, used for dual damascene fabrication is illustrated. Substrate 100 includes a pre-formed dielectric layer 103 (such as silicon dioxide or organic-containing low-k materials) with etched line paths (trenches and vias) in which; a diffusion barrier 105 has been deposited followed by inlaying with copper conductive routes 107. Because copper or other mobile conductive materials have high diffusivities and readily diffuse into the ILD, the underlying silicon devices must be protected from metal ions (e.g., copper) that might otherwise diffuse into the silicon. Suitable materials for diffusion barrier 105 include tantalum, tantalum nitride, titanium nitride, and the like. In a typical process, barrier 105 is formed by a physical vapor deposition (PVD) process such as sputtering or a chemical vapor deposition (CVD) process. Typical metals for the conductive routes are aluminum and copper. More frequently, copper serves as the metal in damascene processes, as depicted in these figures. After fill of metal layer 107 (above the field) the excess metal is removed to the field level (as well as portions of diffusion barrier 105 on the field). This leaves metal inlay 107 exposed on the field region for construction of additional layers. The resultant partially fabricated integrated circuit 100 is a representative substrate for subsequent Damascene processing, as depicted in FIGS. 1B–1H.

As depicted in FIG. 1B, a silicon nitride or silicon carbide diffusion barrier 109 is deposited to encapsulate conductive routes 107. Next, a first dielectric layer, 111, of a dual damascene dielectric structure is deposited on diffusion barrier 109. This is followed by deposition of an etch-stop layer 113 (typically composed of silicon nitride or silicon carbide) on the first dielectric layer 111.

The process follows, as depicted in FIG. 1C, where a second dielectric layer 115 of the dual damascene dielectric structure is deposited in a similar manner to the first dielectric layer 111, onto etch-stop layer 113. Deposition of an antireflective layer 117, typically a silicon oxynitride, follows.

The dual Damascene process continues, as depicted in FIGS. 1D–1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Next, as depicted in FIG. 1F, these newly formed vias and trenches are, as described above, coated with a conformal diffusion barrier 123. As mentioned above, barrier 123 is made of tantalum, tantalum nitride, titanium nitride, or other materials that effectively block diffusion of copper atoms into the dielectric layers.

After diffusion barrier 123 is deposited, a seed layer of copper is applied (typically a PVD process) to enable subsequent electroplating of the features with copper inlay. It is desirable to deposit a uniform conformal layer, but a major problem with conventional PVD methods of depositing seed layers is formation of "overhang" around the openings (top-most portions) of device features. See FIG. 1G. Commonly, a high RF-bias sputter is used to deposit a metal (e.g. copper) seed layer, 124, on diffusion barrier 123. For example, Gopalraja et al. (U.S. Pat. No. 6,724,008) describe a method of via filling including a first step that uses a highly-ionized copper plasma with an RF bias applied to the wafer platen, followed by a more neutral deposition. Using such methods, generally more material is deposited onto the device feature surfaces at the top of the features than at the bottom. This is especially true with high aspect ratio (>3:1) features. Due to re-sputter of more heavily deposited material on the field, overhang, 126, is formed at the aperture of trenches 121. This overhang is problematic because in subsequent metal fill (e.g. electroplate), the overhang prevents complete fill of the features. This creates voids in the metal inlay that causes at best device unreliability or at worst unusable devices. As well, in the high-power low-pressure sputter first step, the wafer incurs a heavy heat load. This is particularly undesirable for low-k materials because it destroys or at least compromises the integrity of the dielectric layer or layers during the seed deposition.

There are conventional methods for addressing the problem of overhang. Iacoponi et al. (U.S. Pat. No. 6,228,754) describe a method in which the step coverage of a seed layer is improved by removing a portion of the seed around the feature opening using a sputter etch. This method only addresses removal of excess material at the top portion of the features. Improved step coverage is achieved by adding an excess of material to all surfaces and then removing a portion of the material at the topmost region of the features. This method does not address the issue of insufficient sidewall coverage (especially in the lower regions of device features) of the seed layer due to the inability of conventional PVD to reach difficult etch topography such as etch undercuts, bowed feature profiles, microtrenches, etc. Such problematic topographies are particularly prevalent in etched low-k materials. Liu et al. describe a multi-step PVD process where in each step a portion of the seed layer is deposited. This method deposits material in each step and the final deposition profile is superposition of each of the individual profiles for each step, however, there is no re-sputter involved. This is a multi-step method, having three or more steps, making it problematic for use in a high throughput production setting.

FIG. 1H shows the completed structure of the dual Damascene process, in which copper conductive routes 125 are inlayed into the via and trench features over the seed (not depicted). Excess copper fill and portions of diffusion barrier 123 on the field have been removed (via CMP or other acceptable method) to provide a field with exposed copper inlay 125. With the advent of advanced low-k materials and increasing smaller device features, structures such as depicted in FIG. 1H, with void-free inlay 125, are harder to achieve due to issues as described above. Therefore improved methods of forming seed layers with acceptable step coverage, minimal overhang, and that access difficult etch topography are needed.

Again referring to FIG. 1H, copper routes 125 and 107 are now in electrical contact and form conductive pathways, as they are separated by only by diffusion barrier 123 which is itself somewhat conductive. Although conformal barrier layers are sufficiently conductive for conventional circuitry, with the continuing need for faster (signal propagation speed) and more reliable microchip circuitry, the resistance of conformal barrier layers made of the materials mentioned above is problematic. The resistance of such barrier layers can be from ten to one hundred times that of copper. Thus, to reduce resistance between the copper routes, a portion of the diffusion barrier may be etched away, specifically at the via bottom, in order to expose the lower copper plug. In this way, the subsequent copper inlay can be deposited directly onto the lower copper plug. Conventional methods for etching away diffusion barriers at the bottom of vias (for example, regions of barrier 123 contacting copper inlay 107 in FIG. 1F) are problematic in that they are not selective enough. That is, conventional etch methods remove barrier material from undesired areas as well, such as the corners (edges) of the via, trench, and field regions. This can destroy critical dimensions of the via and trench surfaces (faceting of the corners) and unnecessarily exposes the dielectric to plasma.

In addition, conventional etching methods do not address unlanded contact applications. As illustrated in FIG. 1F, a portion of diffusion barrier 123 located at via bottom 127 does not fully contact copper inlay 107. In this case, a portion of the barrier rests on copper inlay 107 and a portion rests on dielectric 103. A conventional barrier etch, meant to expose copper inlay 107, would expose both copper inlay 107 and dielectric 103 in region 127. In that case, more process steps would be needed to repair or replace diffusion barrier on the newly exposed region of dielectric 103, before any subsequent copper could be deposited thereon. Using conventional unselective "blanket" conformal deposition methods to re-protect the dielectric, one would create the same problem that existed before the etch, that is, higher resistance between copper routes due to the barrier itself.

What is therefore needed are improved methods of forming diffusion barriers on integrated circuit structures, selective methods in which the portion of the diffusion barrier at the bottom of vias is either completely or partially removed without sacrificing the integrity of the diffusion barrier in other regions. In this way, the resistance between inlayed metal conductive routes is reduced.

Also what is needed are improved methods of depositing seed layers on integrated circuit structures, selective methods that do not impart a high heat load on the wafer and that provide adequate sidewall coverage, especially with difficult fill topographies associated with low-k materials.

SUMMARY OF THE INVENTION

The present invention pertains to methods for forming a metal diffusion barrier on an integrated circuit in which the formation includes at least two operations. The first operation deposits barrier material via PVD or CVD to provide some minimal coverage. The second operation deposits an additional barrier material and simultaneously etches a portion of the barrier material deposited in the first operation. At least part of the first operation is performed in the same reaction chamber as the second operation. Some preferred methods of the invention are entirely done in a single process tool, without breaking vacuum. The result of the operations is a metal diffusion barrier formed in part by net etching in certain areas, in particular the bottom of vias, and a net deposition in other areas, in particular the side walls of vias. Controlled etching is used to selectively remove barrier material from the bottom of vias, either completely or partially, thus reducing the resistance of subsequently formed metal interconnects. In some aspects of the invention, selective etching is also used to remove contaminants under the barrier material, thus obviating a separate preclean operation.

The invention accomplishes simultaneous etch and deposition by creation of unique plasma producing process conditions such that barrier material is etched away in some regions while in other regions barrier material is deposited. Thus, the descriptive term "etch to deposition ratio" or "E/D" is used from herein. More specifically, in the context of a partially fabricated integrated circuit having via and trench surface features, methods described herein provide that E/D varies as a function of the elevation profile of the surface features to which the plasma is applied. Generally, E/D is greatest at the bottom most regions of the wafer surface features and decreases in magnitude as elevation increases.

In this invention, there are three E/D scenarios created by control of process conditions. In the first scenario, E/D is greater than 1 at the via bottom, on the trench step, and on the field region. In the second scenario, E/D is greater than 1 at the via bottom and on the trench step, but less than one on the field region. In the third scenario, E/D is greater than 1 at the via bottom, but less than 1 on the trench step and on the field region. By using these three E/D scenarios, a variety of stack barrier layer structures are realized.

A preferred material for this etch/deposition sputter is tantalum, although the invention is not limited to tantalum. Other materials for which the invention is applicable include but are not limited to titanium, tungsten, cobalt, solid solutions (interstitial forms) of tantalum and nitrogen, and binary nitrides (e.g. $TaN_x$, TiN, $WN_x$). After diffusion barriers of the invention are formed, a metal conductive layer is deposited thereon. Where methods of the invention create a diffusion barrier having no barrier material at the bottom of the vias, the metal conductive layer makes direct contact with exposed metal conductive routes. Thus, one aspect of the invention is a method for depositing a diffusion barrier and a metal conductive layer for metal interconnects on a wafer substrate. Such methods may be characterized by the following sequence: (a) depositing a first portion of the diffusion barrier over the surface of the wafer substrate, (b) etching through the first portion of the diffusion barrier at the bottom of a plurality of vias while depositing a second portion of the diffusion barrier elsewhere on the wafer substrate, and (c) depositing the metal conductive layer over the surface of the wafer substrate such that the metal conductive layer contacts an underlying metal layer only at the bottom of the plurality of vias. Preferably at least part of (a) and all of (b) are performed in the same processing chamber. Additionally, the wafer may be precleaned before (a) in some preferred methods. In some preferred embodiments, all of (a)–(c) are performed in the same processing tool.

For unlanded vias (and in some instances for fully landed vias as well), methods of the invention create a diffusion barrier having minimal barrier material at the bottom of the vias. In this case, the resistance of the barrier between the metal conductive layer and underlying metal conductive routes is minimized. Thus, another aspect of the invention is a method for depositing a diffusion barrier and a metal conductive layer for metal interconnects on a wafer substrate. Such methods may be characterized by the following sequence: (a) precleaning the wafer substrate, (b) depositing a first portion of the diffusion barrier over the surface of the wafer substrate, (c) etching part-way through the first portion of the diffusion barrier at the bottom of a plurality of vias while depositing a second portion of the diffusion barrier elsewhere on the wafer substrate such that the diffusion barrier has a minimum thickness at the bottom of the plurality of vias, and (d) depositing the metal conductive layer over the surface of the wafer substrate. Preferably at least part of (b) and all of (c) are performed in the same processing chamber. In some preferred embodiments, all of (a)–(d) are performed in the same processing tool.

Preferably methods of the invention are used in Damascene processing in which the metal conductive layer and interconnects are made of copper. In some preferred methods of the invention, the metal conductive layer is a copper seed layer. Preferably seed layers of the invention are formed using PVD, but the invention is not limited in this way. As mentioned, in some methods of the invention, all aspects of a process flow for forming a diffusion barrier and depositing a metal conductive route thereon are done in the same processing tool.

Methods of the invention create diffusion barriers having stack structures. Distinct portions of each stack may be deposited (layered) using PVD, CVD, or other methods. Thus diffusion barriers of the invention may have bilayered or trilayered structures. Preferably, the portions include at least one of tantalum, nitrogen-doped tantalum, tantalum nitride, and titanium silicon nitride. More detail of preferred arrangements for the layering of these materials, methods of depositing, and structure of the diffusion barriers formed therefrom, will be described in the detailed description below.

Methods of the invention create diffusion barriers within integrated circuitry using at least the materials described above. Therefore, another aspect of the invention pertains to an integrated circuit or a partially fabricated integrated circuit. Preferably integrated circuits or partially fabricated integrated circuits of the invention include: a diffusion barrier which covers all surfaces of a plurality of vias and a plurality of trenches except that there is no diffusion barrier material at the bottom of the plurality of vias, and a metal conductive layer provided thereon, such that the metal conductive layer comes in direct contact with a plurality of metal conductive routes at the bottom of the plurality of vias. Particularly (but not necessarily) for unlanded vias, yet another aspect of the invention is an integrated circuit or a partially fabricated integrated circuit comprising: a diffusion barrier which covers all surfaces of a plurality of vias and a plurality of trenches, the diffusion barrier having a thickness of between about 50 and 400 Å on the surfaces except at the bottom of the plurality of vias where there is less than about 50 Å of diffusion barrier material; and a metal conductive layer provided thereon.

Other methods of the invention create seed layers for interconnect applications. Thus another aspect of the invention is a method for depositing a metal seed layer on a wafer substrate having a plurality of recessed device features. Such methods may be characterized by the following operations: (a) depositing a first portion of the metal seed layer on the wafer substrate, wherein the first portion comprises substantially no overhang on the opening of each of the plurality of recessed device features and the first portion includes bottom coverage in each of the plurality of recessed device features that is between about 20 and 100 percent as thick as that part of the first portion of the seed layer on the field of the wafer substrate; and (b) depositing a second portion of the metal seed layer while simultaneously redistributing at least part of the first portion on the bottom of each of the plurality of recessed device features from the bottom to the corresponding sidewalls of each of the plurality of recessed features. The bottom coverage depends upon the aspect ratio of the particular recessed device feature in which the seed layer is formed. Preferably for a recessed device feature having an aspect ratio of between about 3:1 and 4:1, the bottom coverage in (a) is between about 50 and 80 percent as thick as that part of the first portion of the seed layer on the field of the wafer substrate. Preferably the metal seed layer includes copper.

Preferably, depositing a first portion of the metal seed layer on the wafer substrate is performed using a first plasma including a plurality of metal ions, the plurality of metal ions impinging on the wafer substrate substantially perpendicular to the wafer substrate work surface. That is, preferably the metal flux is highly ionized but the ions have relatively low kinetic energy (high source power used and optionally an RF bias applied) and the metal is deposited substantially unidirectionally as described so that overhang formation is minimized. Generally, the DC (source) power used to perform (a) is more than that used to perform (b).

Preferably the first plasma is produced at a pressure of between about 1 and 30 mTorr, more preferably at about 20 mTorr. Preferably the source power used to generate the first plasma is between about 15 and 50 kW, more preferably about 36 kW. Preferably the wafer substrate is held at a temperature of between about −100° C. and 50° C., more preferably about 0° C. during seed layer formation as described above. An RF bias may be applied. Preferably an RF frequency of between about 100 kHz and 50 MHz, more preferably about 13.56 MHz is applied to the wafer substrate during deposition of the first portion of the metal seed layer on the wafer substrate. Preferably an RF power of between about 0 and 300 W is applied, more preferably about 300 W. Preferably, the ratio of the RF power to the DC (source) power is between about 0 and 20:1 W/kW, more preferably about 8:1 W/kW. By keeping the ratio of RF power to the DC (source) power in this range, re-sputter during (a) is inhibited.

In a particularly preferred embodiment, the first plasma is subjected to a first downstream magnetic field prior to impinging on the wafer, the first magnetic field having a field strength of between about 36 and 1080 amp-turn, more preferably about 180 amp-turn. Even more preferably the first plasma is subjected to a second downstream magnetic field prior to impinging on the wafer, the second magnetic field having a field strength of between about 130 and 3960 amp-turn, more preferably about 830 amp-turn.

Preferably the first portion is between about 300 Å and 1500 Å thick on the wafer substrate field and the horizontal surfaces of each of the plurality of recessed device features. Preferably the first portion is about 800 Å thick at least on the field of the wafer substrate.

Preferably, depositing a second portion of the metal seed layer while simultaneously redistributing at least part of the first portion on the bottom of each of the plurality of recessed device features from the bottom to the corresponding sidewalls of each of the plurality of recessed features is performed using a second plasma. Preferably the second plasma includes a plurality of metal atoms and a plurality of inert gas ions, the plurality of metal atoms impinging on the wafer substrate at substantially random angles and the plurality of inert gas ions impinging on the wafer substrate substantially perpendicular to the wafer substrate work surface. That is, preferably the metal atoms are deposited at random angles, while the inert gas ions re-sputter some of the first portion from the bottom of the features to the sidewalls of the features.

Preferably the second plasma is produced at a pressure of between about 1 and 30 mTorr, more preferably at about 20 mTorr. Preferably the DC source power used to generate the second plasma is between about 1 and 15 kW, more preferably about 9 kW. Preferably an RF frequency of between about 100 kHz and 50 MHz, more preferably about 13.56 MHz is applied to the wafer substrate during deposition of the second portion of the metal seed layer with simultaneous redistribution at least part of the first portion. Preferably an RF power of between about 100 and 500 W is applied, more preferably about 400 W. Preferably, the ratio of the RF power to the DC (source) power is between about 6.6:1 W/kW and 500:1 W/kW, more preferably about 45:1 W/kW. By keeping the ratio of RF power to the DC (source) power in this range, re-sputter as described for (b) is achieved.

In a particularly preferred embodiment, the second plasma is subjected to a first downstream magnetic field prior to impinging on the wafer, the first magnetic field having a field strength of between about 36 and 1080 amp-turn, more preferably about 795 amp-turn. Even more preferably the second plasma is subjected to a second downstream magnetic field prior to impinging on the wafer, the second magnetic field having a field strength of between about 130 and 3960 amp-turn, more preferably about 1580 amp-turn.

Preferably, after depositing the first portion of the metal seed layer and depositing the second portion of the metal seed layer while simultaneously redistributing at least part of the first portion as described above, the thickness of the completed metal seed layer, at the bottom of each of the plurality of recessed device features is between about 25 Å and 500 Å thick, more preferably between about 50 Å and 100 Å thick.

These and other features and advantages of the present invention will be described in more detail below with reference to the associated drawings.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the term wafer will be used interchangeably with partially fabricated integrated circuit. One skilled in the art would understand that the term "partially fabricated integrated circuit" can refer to a silicon wafer during any of many stages of integrated circuit fabrication thereon. Thus, "wafer", "wafer substrate", and "substrate" are all used interchangeably.

Figure 1A:
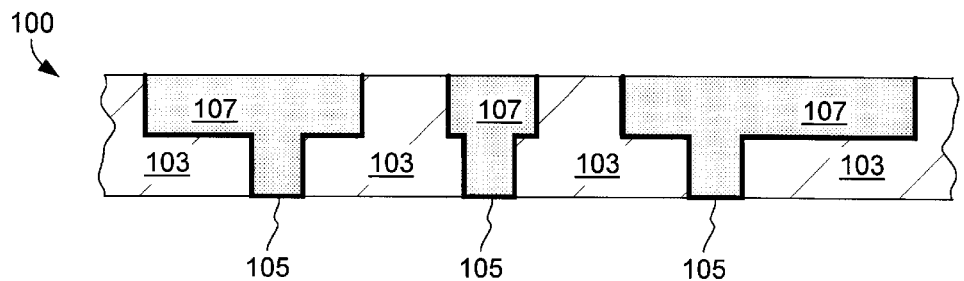
FIGS. 1A–H show cross sectional depictions of a copper dual Damascene fabrication process.
Figure 1B:
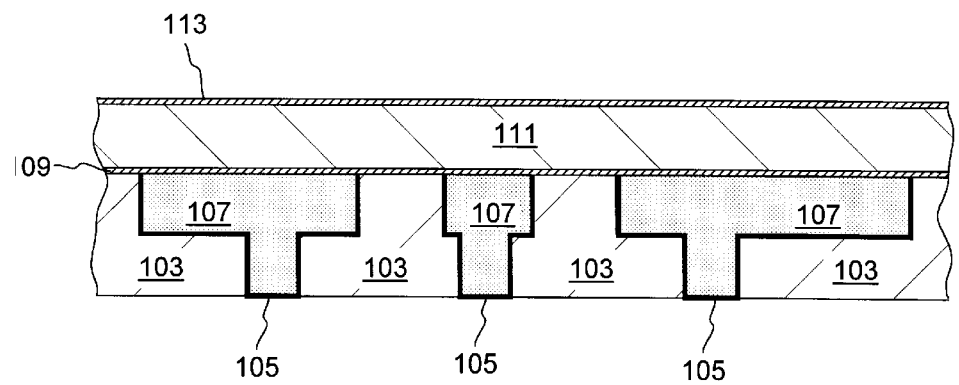
Figure 1C:
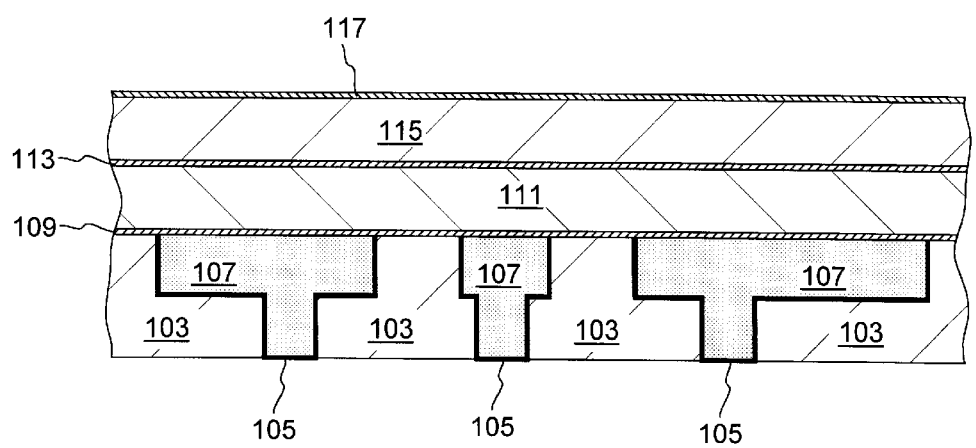
Figure 1D:
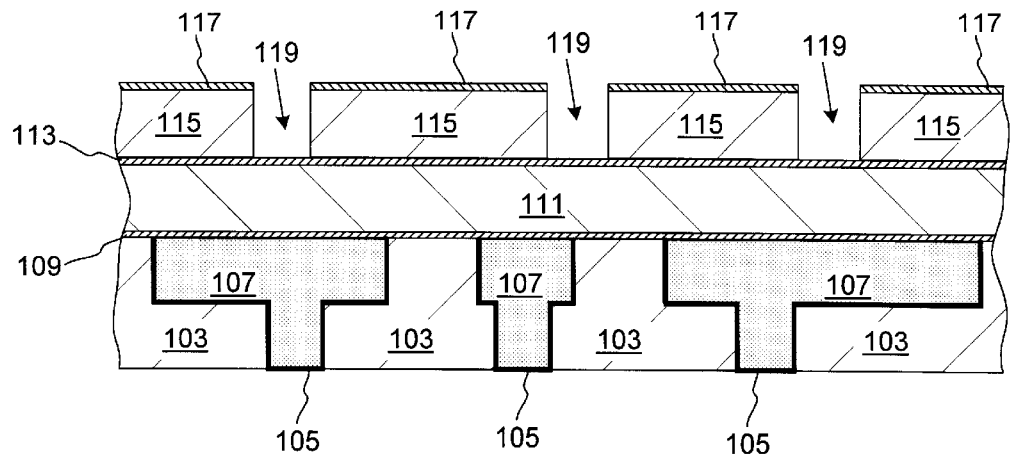
Figure 1E:
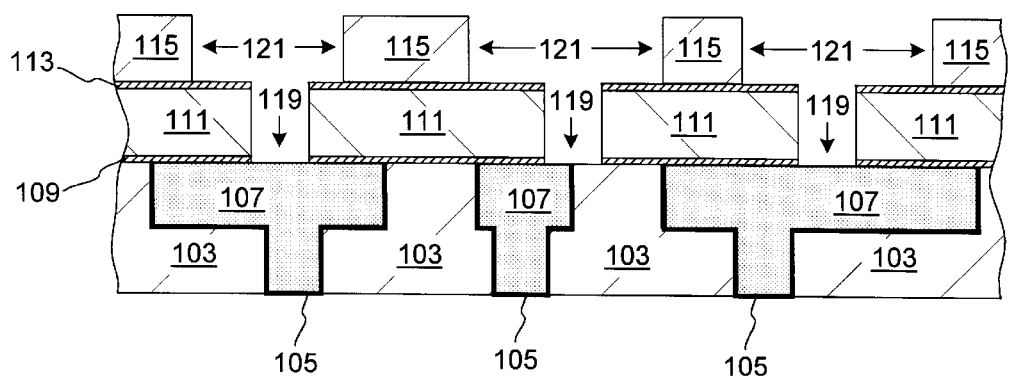
Figure 1F:
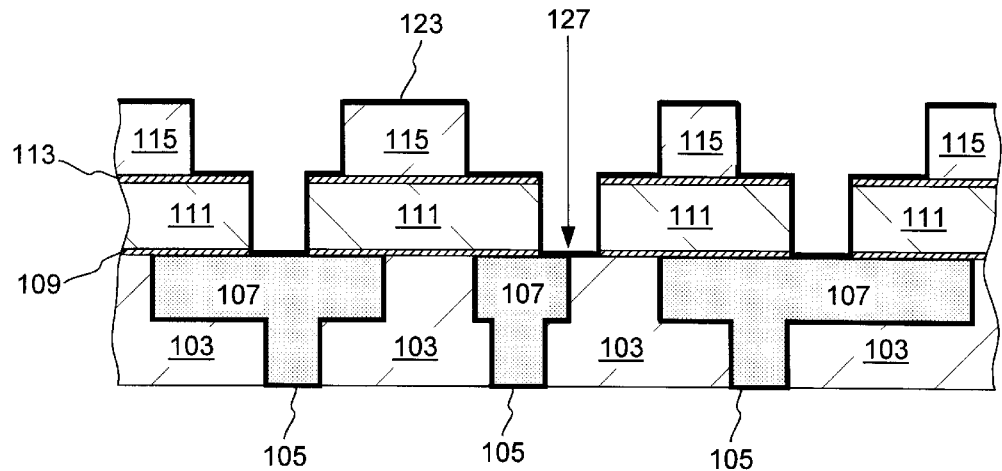
Figure 1G:
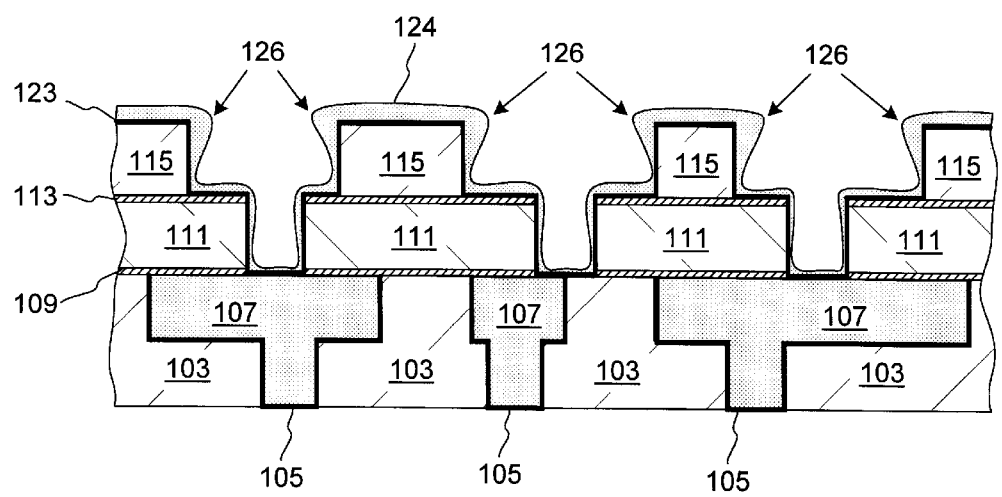
Figure 1H:
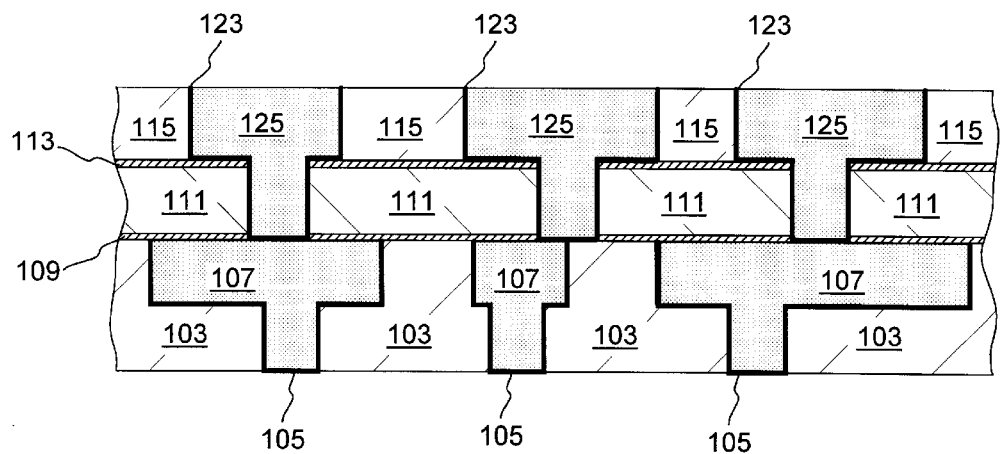
Figure 1I:
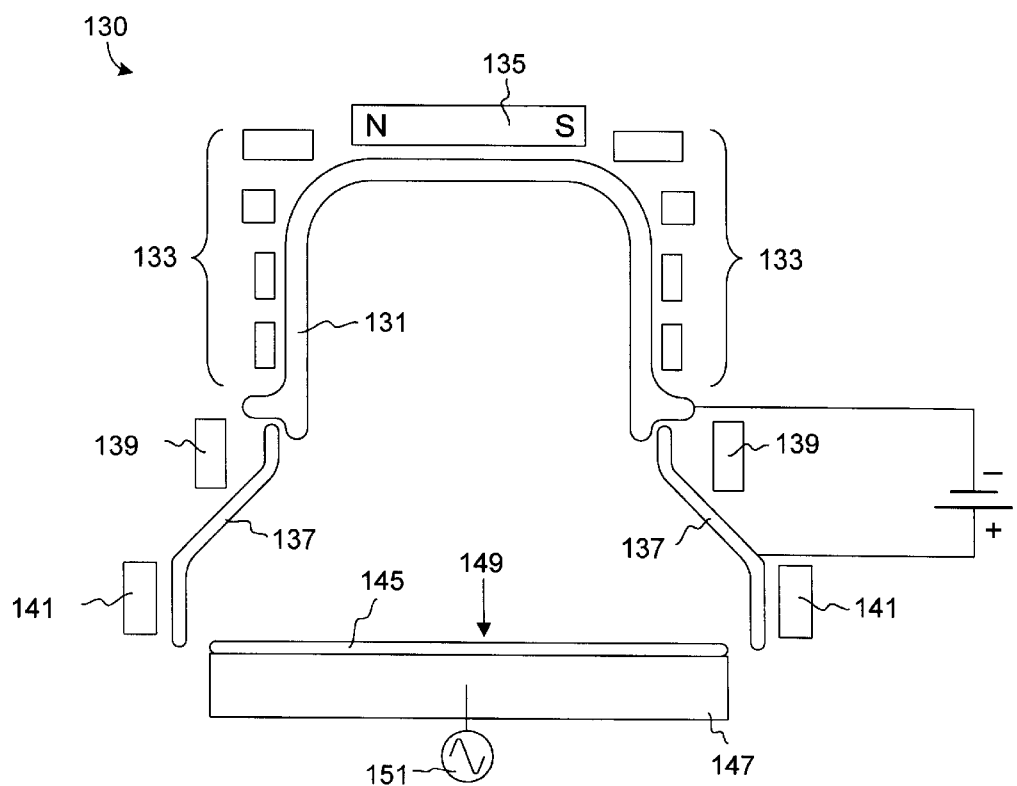
FIG. 1I shows a cross-section of an exemplary apparatus used to perform methods of the invention.

FIG. 1I depicts a simplified cross section of a sputter apparatus, 130, which is generally representative of an HCM module of the INOVA process system, available from Novellus Systems, of San Jose Calif. The INOVA apparatus is particularly useful in performing methods of the invention, but the invention is not limited to this system. The INOVA process system includes a hollow cathode magnetron (HCM) sputtering source. A generic description of such a source is provided below in relation to FIG. 1I.

Apparatus 130 includes a cup-shaped sputter target 131. Arranged about the exterior surfaces of target 131 are magnets, including permanent magnets 133 and 135, and electromagnetic coils 139 and 141. Permanent magnets 135 and 133 (a magnetic array) are used to generate plasma within the HCM target, while electromagnetic coils 139 and 141 are used to shape the magnetic flux and/or direct the plasma in a particular way. This particular configuration of magnets is for the 200 mm wafer apparatus, for larger wafers the magnet positioning and strength may vary. Target 131 serves as a cathode in an electrical circuit (preferably a DC circuit). A circumferential shield, 137, is designed to protect more sensitive parts (not shown) of the sputter apparatus from exposure to plasma. Shield 137 also serves as the anode of the electrical circuit, in this example. A wafer substrate, 145, is positioned atop of wafer holder 147. Plasma generated within hollow cathode magnetron (HCM) target 131 leaves the interior of the target and impinges on the work surface, 149, of the wafer substrate. Of particular utility are electromagnetic coil 139 (the "m-coil") and electromagnetic coil 141 (the "d-coil"). These coils are used to control the uniformity in the plasma and thereby control the uniformity of sputtered layers on the wafer substrate. An RF bias can be applied to the wafer holder so that ions are directionally biased toward impinging the wafer perpendicular to wafer work surface 149 (arrow in FIG. 1I denotes direction of ions when large RF bias is applied to the wafer holder). An RF field generator can be positioned in the wafer table (as suggested in FIG. 1I) or below it. Thus by modulating the field strength created by the electromagnetic coils, the pressure, the RF bias, and the source power, the dynamics and characteristics of plasmas created with such apparatus can be varied widely. Methods of the invention for forming diffusion barriers and seed layers are described in relation to such exemplary apparatus.

DIFFUSION BARRIERS OF THE INVENTION

Figure 2A:
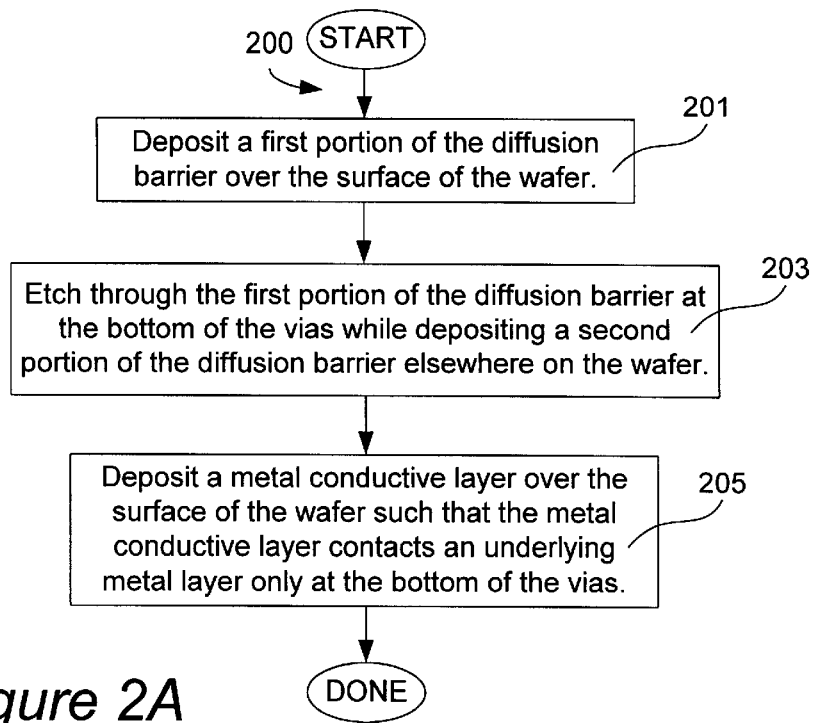
FIG. 2A presents aspects of a method for forming a diffusion barrier of the invention.
Figure 3A:
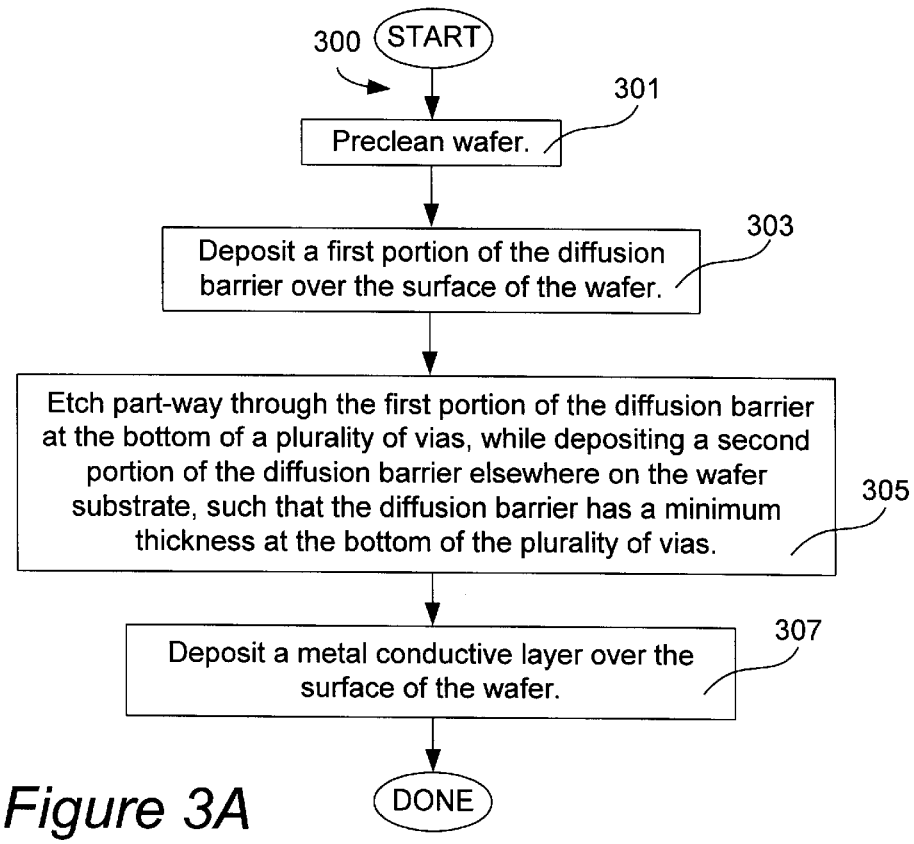
FIG. 3A presents aspects of a method for forming another diffusion barrier of the invention.

As mentioned, the invention finds particular use in Damascene processing. FIGS. 2A and 3A present aspects of process flows for forming diffusion barriers of the invention. Typically, the process flows are performed in the context of copper Damascene processing. One can refer back to FIGS. 1A–1H for a slightly broader context. Specifically, referring to FIG. 1E, once vias and trenches have been formed in a wafer, typically a diffusion barrier will be formed thereon. For wafer substrates having vias that are entirely landed over underlying metal surfaces, methods of the invention which etch through barrier material at the bottom of vias may be preferable. In some instances a wafer substrate may have unlanded vias (as described in the background section in reference to FIG. 1E). For wafer substrates having unlanded vias, methods of the invention that etch the barrier material at the bottom of the vias to a minimum thickness are preferred.

Also as mentioned, the invention accomplishes simultaneous etch and deposition by creation of unique plasma producing process conditions such that barrier material is etched away in some regions while in other regions barrier material is deposited. More specifically, methods described herein provide that E/D varies as a function of the elevation profile of the surface features to which the plasma is applied. Generally, E/D is greatest at the bottom most regions of the wafer surface features and decreases in magnitude as elevation increases. In this invention, there are three E/D scenarios created by control of process conditions. In the first scenario, E/D is greater than 1 at the via bottom, on the trench step, and on the field region. In this first scenario, deposition of barrier material (occurring simultaneously with etch) occurs only on the side walls of the wafer surface features. In the second scenario, E/D is greater than 1 at the via bottom and on the trench step, but less than one on the field region. In this second scenario, deposition of barrier material (occurring simultaneously with etch) occurs not only on the side walls of the wafer surface features, but also on the field. In the third scenario, E/D is greater than 1 at the via bottom, but less than 1 on the trench step and on the field region. In this third scenario, deposition of barrier material (occurring simultaneously with etch at the via bottom) occurs not only on the side walls but also on the trench step and field.

A method 200, of forming diffusion barriers of the invention will now be described with reference to the flow chart of FIG. 2A and associated schematic diagrams in FIGS. 2B–2E. Note that in many embodiments, each of the depicted process operations are carried out using process conditions and materials specific to a particular desired outcome. Specific examples will be discussed in detail below.

Referring to FIG. 2A, aspects of a process flow, 200, for forming a diffusion barrier of the invention are depicted. A first portion of the diffusion barrier is deposited over the surface of the wafer. See 201.

Figure 2B:
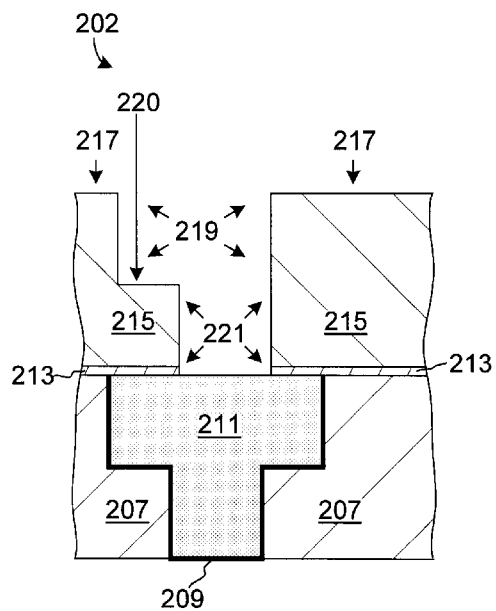
FIGS. 2B–E are cross-sectional depictions that illustrate various aspects of a process flow for forming a diffusion barrier of the invention as described in FIG. 2A.

Referring to FIG. 2B, a typical substrate, 202, is illustrated. Substrate 202 includes a preformed dielectric layer 207 (such as silicon dioxide or organic-containing low-k materials) with etched line paths (trenches and vias) in which; a diffusion barrier 209 has been deposited followed by inlaying with copper conductive route 211. A silicon nitride or silicon carbide barrier layer 213 was laid thereon, followed by another layer of dielectric material, 215. After process steps (including lithography) for example as outlined in the background section above, dielectric layer 215 has etched trench 219 and via 221. Note that included in this surface feature are horizontal surfaces (field 217, step 220 of trench 219, and bottom of via 221) and vertical surfaces (the side walls of the via and trench). At the bottom of via 221, copper conductive route 211 is exposed. In some embodiments it is desired to preclean contaminants from these features before deposition of barrier material, this can be done in the same processing chamber or not. In other embodiments, the simultaneous etch/deposition (as described below) is used to remove surface contaminants from the via bottom by etching through a barrier material thereon. In this way, the barrier is removed only at the via bottom and the exposed copper is effectively cleaned (etched) by exposure to the plasma. Contaminants include residues left from etch and photoresist clean processes and oxides of copper in some instances.

Again referring to 201 in FIG. 2A, deposition of the first portion of the diffusion barrier may be done using PVD or CVD. Preferably, the first portion of the diffusion barrier includes at least one of tantalum, nitrogen-doped tantalum, tantalum nitride, and titanium silicon nitride. Tantalum, nitrogen-doped tantalum, and tantalum nitride are preferably deposited using PVD. As mentioned, other materials for which the invention is applicable include but are not limited to titanium, tungsten, cobalt, solid solutions (interstitial forms) of tantalum and nitrogen, and binary nitrides (e.g. $TaN_x$, TiN, $WN_x$). These materials would also preferably be deposited by PVD. Titanium silicon nitride is preferably deposited using CVD. The first portion of the diffusion barrier is preferably a conformal (contour following, continuous, and of relatively uniform thickness) monolayer. In this description, the term "monolayer" is meant to mean a single layer of material, not necessarily a single atomic or molecular layer as the term is sometimes used. In some embodiments, a bilayer is preferred for the first portion of the diffusion barrier.

Figure 2C:
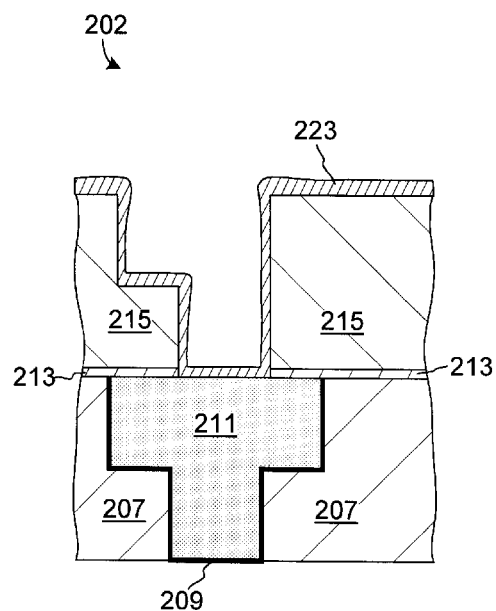

FIG. 2C depicts substrate 202, after deposition of the first portion of the diffusion barrier. In this example the first portion is a conformal monolayer 223 that covers all surfaces of substrate 202. Preferably, the monolayer is between about 50 and 300 Å thick on the field of the wafer, more preferably about 100 Å thick.

Figure 2D:
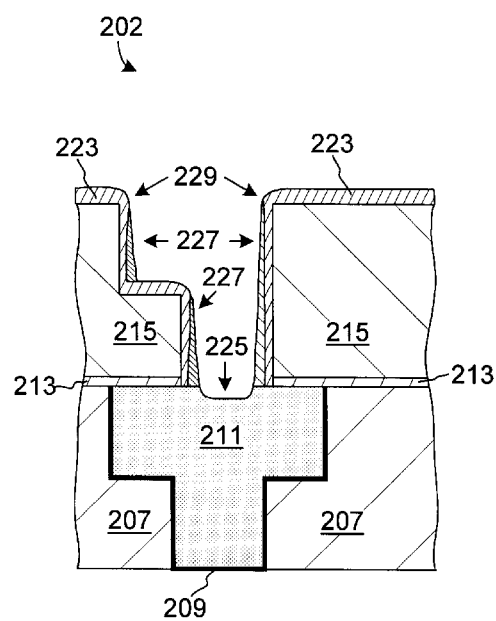

Referring to FIG. 2A, once the first portion of the diffusion barrier is deposited, simultaneous etch/deposition is used to etch through the first portion of the diffusion barrier at the bottom of the vias while depositing a second portion of the diffusion barrier elsewhere on the wafer. See 203. Preferably the second portion of the diffusion barrier is a sputtered metal. Even more preferably, the sputtered metal is tantalum. FIG. 2D depicts substrate 202 after such an etch/deposition process in which the etch to deposition ratio was greater than 1, both in the bottom of via 221 and on the horizontal surfaces (field 217 and step 220 (see FIG. 2B)). The relative rate of etch was controlled such that step 220 and field 217 were minimally etched relative to the bottom of via 221. Thus, the first portion 223 is etched through at the bottom of via 221, exposing the surface of copper conductive route 211. See 225. Concurrent with the etch, barrier material 227 (the second portion) is deposited on the side walls of the via and trench. Preferably, the second portion will have between about 25 and 100 Å of barrier material. Additionally, there is minimal faceting of the corners (unlike conventional etching methods). See 229.

Thus, the resulting structure 202 has a diffusion barrier (bilayer) that includes first portion 223 and second portion 227. The diffusion barrier is discontinuous, in that it does not cover copper conductive route 211. Note that even though plasma etch was used and copper route 211 was exposed, the dielectric layers were not exposed to plasma during the method. This is a distinct advantage over conventional diffusion barrier formation methods which involve a plasma etch.

Note also that in some instances it has been experimentally determined that there may be a finite amount of the barrier material (e.g. tantalum) implanted into the copper conductive route surface at the bottom of the via. In this invention, this scenario is still considered to mean "exposed copper" at the via bottom, since the tantalum is implanted into the copper and subsequent copper seed layer or inlay makes direct contact with this "doped" copper surface.

Figure 2E:
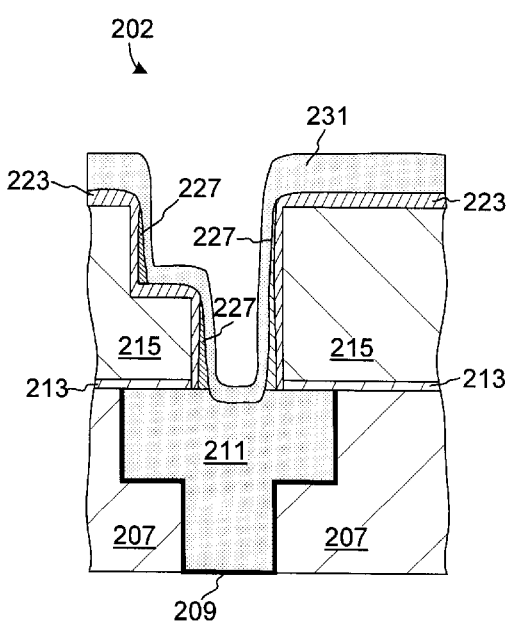

Referring again to FIG. 2A, once the diffusion barrier is formed, a metal conductive layer 231 is deposited over the surface of the wafer such that the metal conductive layer contacts the underlying metal layer only at the bottom of the vias. See 205. FIG. 2E depicts substrate 202 after deposition of metal conductive layer 231. In this example, the metal conductive layer is a copper seed layer, but the invention is not limited to seed layers. For example, the metal conductive layer can comprise an electroless metal fill. Once the metal conductive layer is deposited, the method 200 is done.

As illustrated in FIG. 2E, newly deposited metal conductive layer 231 now is in direct contact with underlying copper inlay 211. Substrate 202 is now ready for bulk electroplating or electroless fill for formation of conductive routes that will fill completely its surface features.

Figure 2F:
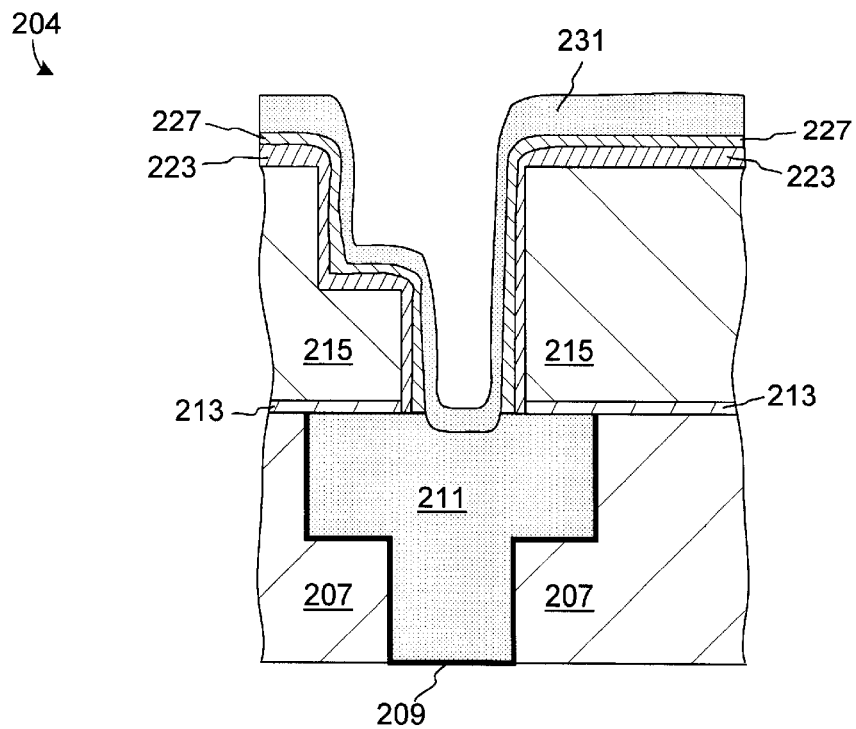
FIG. 2F is a cross-sectional depiction of a portion of a partially fabricated integrated circuit of the invention that is made using a process flow similar to that described for FIGS. 2B–E.

In the above description, and as illustrated in FIGS. 2D–E, the second portion (227) of the barrier layer is deposited only on the side walls of the surface features of substrate 202. Some methods of the invention use etch to deposition ratios greater than one at the via bottom, but less than one on the field and trench regions. In this case, the second portion of barrier material will be deposited on the field and trench as well as the side walls. Preferably, the second portion will have between about 50 and 500 Å of barrier material deposited on the field and horizontal trench surfaces. FIG. 2F, depicts the resulting structure 204 obtained (after seed layer deposition). Structure 204 is similar to structure 202 (depicted in FIG. 2E), except that a diffusion barrier is formed in which second portion 227 now covers all of the remaining first portion 223 (that which was not etched through). Thus, E/D in the trench and on the field was less than one, while at the bottom of the via, E/D was greater than one. Copper conductive route 211 was still exposed at the bottom of the via (due to E/D>1) and thus seed layer 231 is in direct contact with 211, analogous to structure 202 (FIG. 2E).

Figure 2G:
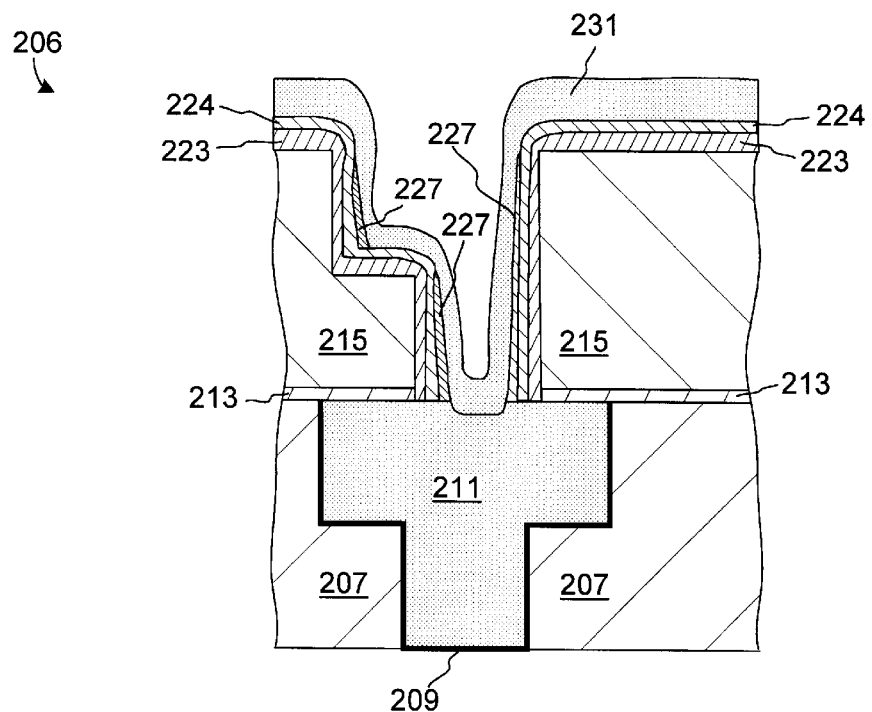
FIG. 2G is a cross-sectional depiction of a portion of another partially fabricated integrated circuit of the invention that is made using a process flow similar to that described for FIGS. 2B–E.

In another preferred method of the invention, the first portion of the diffusion barrier will be a bilayer, and once the second portion is deposited a trilayer will result. If the first portion of the diffusion barrier is a bilayer, the bilayer will be made of a first deposited layer and a second deposited layer thereon. Either of the first or second deposited layers of the bilayer may include at least one of tantalum, nitrogen-doped tantalum, tantalum nitride, and titanium silicon nitride. These materials are preferably deposited as mentioned above. FIG. 2G depicts an example substrate 206, having such a trilayer diffusion barrier. In this case, a conformal layer 223 is deposited over the surface of the wafer, then another conformal layer 224 is deposited thereon (co-continuous, covering the entire surface). Once the bilayer (first portion) is deposited, then the second portion of the diffusion barrier is deposited using the simultaneous etch/deposition method. In this example, the second portion, 227, is deposited only on the side walls and layers 223 and 224 are etched though at the bottom of the via. The resulting barrier layer is the trilayer structure depicted in FIG. 2G (shown with copper seed layer 231 deposited on the diffusion barrier). Alternatively, second portion 227 can be deposited on the trench and field horizontal surfaces as well as the side walls.

Diffusion barrier stack structures (bilayers, trilayers, etc.) can provide better protection against metal diffusion than single layers due to the combined properties of the individual layers of which they are made. In some cases, multi-layered diffusion barriers can also be made thicker to serve as a fill element. For example, in some low-k dielectric applications, lithography leaves the dielectric with undercuts (notches) or bowing (concavity) in the side walls. These defects can be repaired by deposition of extra barrier material which fills the defects. Judicious combinations of CVD and PVD methods are used to achieve this end. One problem with this approach is the resistance at the via bottom due to multiple layers of barrier material. The instant invention solves this problem. For example, depending on the need, in accordance with FIG. 2G, layer 223 or layer 224 may be deposited using either CVD or PVD. Methods of the invention enhance defect repair methodology by providing methods that either remove or minimize unwanted barrier material at the bottom of the vias.

In order to describe formation of diffusion barriers intended primarily (but not necessarily) for unlanded vias, a method 300, of forming diffusion barriers of the invention will now be described with reference to the flow chart of FIG. 3A and associated schematic diagrams in FIGS. 3B–3E. Again, note that in many embodiments, each of the depicted process operations are carried out using process conditions and materials specific to a particular desired outcome. The invention is not limited to these specific embodiments, but rather they are intended to illustrate the invention.

Referring to FIG. 3A, aspects of a process flow, 300, for forming a diffusion barrier of the invention are depicted. The wafer is precleaned. See 301. Precleaning is performed in the case of unlanded vias, because subsequently deposited barrier material will not be fully etched through at the bottom of the via. Thus any contaminants that reside on the via prior to deposition of barrier material would remain there if not removed in a preclean operation. Next, a first portion of the diffusion barrier is deposited over the surface of the wafer. See 303.

Figure 3B:
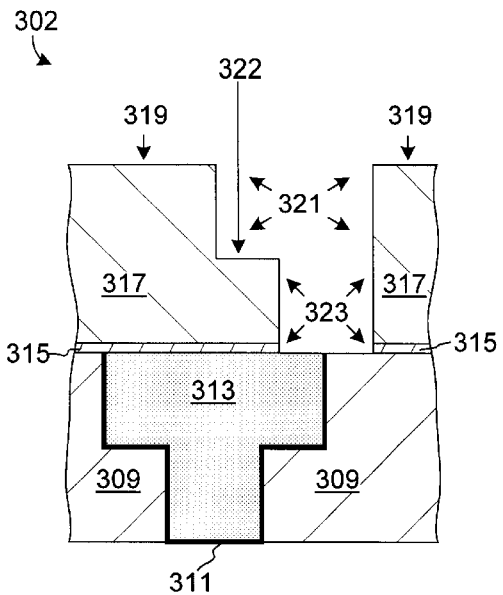
FIGS. 3B–E are cross-sectional depictions that illustrate various aspects of a process flow for forming another diffusion barrier of the invention as described in FIG. 3A.

Referring to FIG. 3B, a typical substrate, 302, is illustrated. Substrate 302 includes a pre-formed dielectric layer 309 (such as silicon dioxide or organic-containing low-k materials) with etched line paths (trenches and vias) in which; a diffusion barrier 311 has been deposited followed by inlaying with copper conductive route 313. A silicon nitride or silicon carbide barrier layer 315 was laid thereon, followed by another layer of dielectric material, 317. After process steps (including lithography) for example as outlined in the background section above, dielectric layer 317 has etched trench 321 and via 323. Note that included in this surface feature are horizontal surfaces (field 319, step 322 of trench 321, and the bottom of via 323) and vertical surfaces (the side walls of the via and trench). The surface area at the bottom of via 323, includes a portion of exposed copper conductive route 313 and a portion of exposed dielectric 309. As mentioned, it is desired to preclean (preferably in the same processing tool) contaminants from these surfaces prior to deposition of barrier material. Contaminants include residues left from etch and photoresist clean processes and oxides of copper in some instances.

Figure 3C:
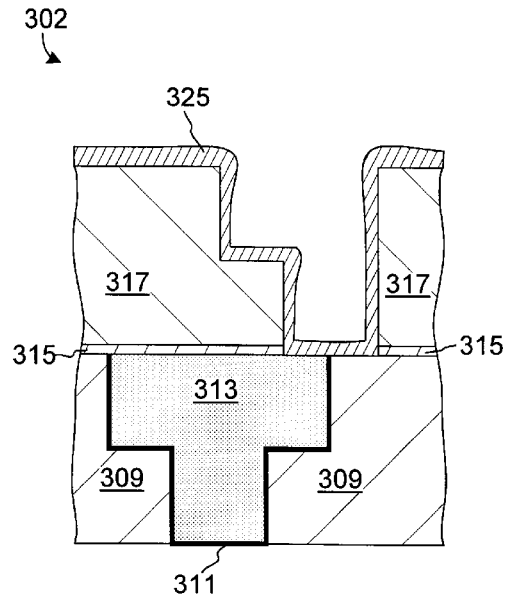

Again referring to 303 in FIG. 3A, deposition of the first portion of the diffusion barrier may be done using PVD or CVD. Preferably, the first portion of the diffusion barrier includes at least one of tantalum, nitrogen-doped tantalum, tantalum nitride, and titanium silicon nitride. Tantalum, nitrogen-doped tantalum, and tantalum nitride are preferable deposited using PVD. Titanium silicon nitride is preferably deposited using CVD. The first portion of the diffusion barrier is preferably a conformal monolayer. In some embodiments, a bilayer is preferred for the first portion of the diffusion barrier. FIG. 3C depicts substrate 302, after deposition of the first portion of the diffusion barrier. In this example the first portion is a conformal monolayer 325 that covers all surfaces of substrate 302. Preferably, the monolayer is between about 50 and 300 Å thick on the field of the wafer, more preferably about 100 Å thick.

Referring to FIG. 3A, once the first portion of the diffusion barrier is deposited, simultaneous etch/deposition is used to etch part way through the first portion of the diffusion barrier at the bottom of the vias while depositing a second portion of the diffusion barrier elsewhere on the wafer. Preferably, this process creates a diffusion barrier having a minimum thickness at the bottom of the via. See 305. Preferably, the minimum thickness will be between about 30 and 100 Å while the diffusion barrier on the side walls and horizontal surfaces is between about 50 and 400 Å thick.

Figure 3D:
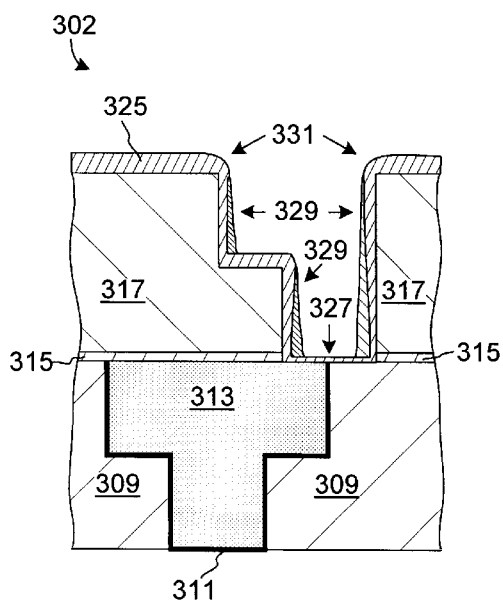

FIG. 3D depicts substrate 302 after such an etch/deposition process in which the etch to deposition ratio was greater than 1, both in the bottom of via 323 and on the horizontal surfaces (field 319 and step 322 (see FIG. 3B)). The relative rate of etch was controlled such that step 322 and field 319 were minimally etched relative to the bottom of via 323. Thus, the first portion 325 is etched to a minimum thickness at the bottom of via 323. See 327. Barrier material 329 (the second portion) is however deposited on the side walls of the via and trench. Preferably, the second portion will have between about 25 and 100 Å of barrier material. Additionally, there is minimal faceting of the corners (unlike conventional etching methods). See 331. Thus, the resulting structure 302 has a diffusion barrier (bilayer) that includes continuous first portion 325 and discontinuous second portion 329.

Figure 3E:
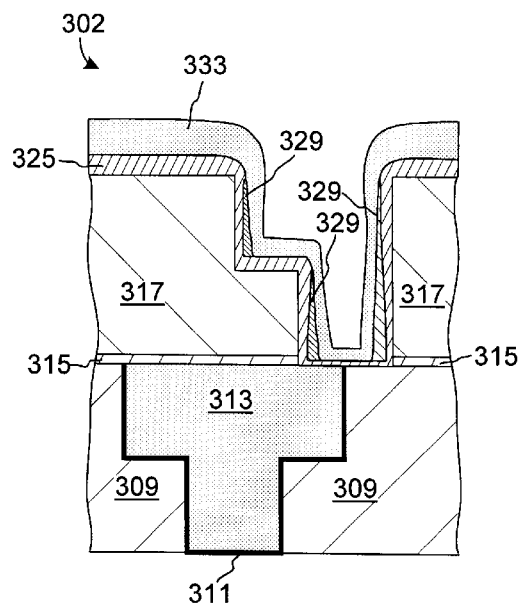

Referring again to FIG. 3A, once the diffusion barrier is formed, a metal conductive layer 333 is deposited over the surface of the wafer. See 307. FIG. 3E depicts substrate 302 after deposition of metal conductive layer 333. In this example, the metal conductive layer is a copper seed layer, but the invention is not limited to seed layers. Once the metal conductive layer is deposited, the method 300 is done.

As illustrated in FIG. 3E, newly deposited metal conductive layer 333 is separated from underlying copper inlay 313 by a region of the diffusion barrier having minimal thickness. Preferably between about 25 and 300 Å are removed to provide this minimal thickness. Substrate 302 is now ready for bulk electroplate (or electroless metal deposition) for formation of conductive routes which will fill completely its surface features.

In the above description, and as illustrated in FIGS. 3D–E, the second portion of the barrier layer is deposited only on the side walls of the surface features of substrate 302. As mentioned, some methods of the invention use etch to deposition ratios greater than one at the via bottom, but less than one on the field and trench regions. In this case, the second portion of barrier material will be deposited on the field and trench as well as the side walls. Preferably, the second portion has between about 50 and 500 Å of barrier material deposited on the field and horizontal trench surfaces.

Figure 3F:
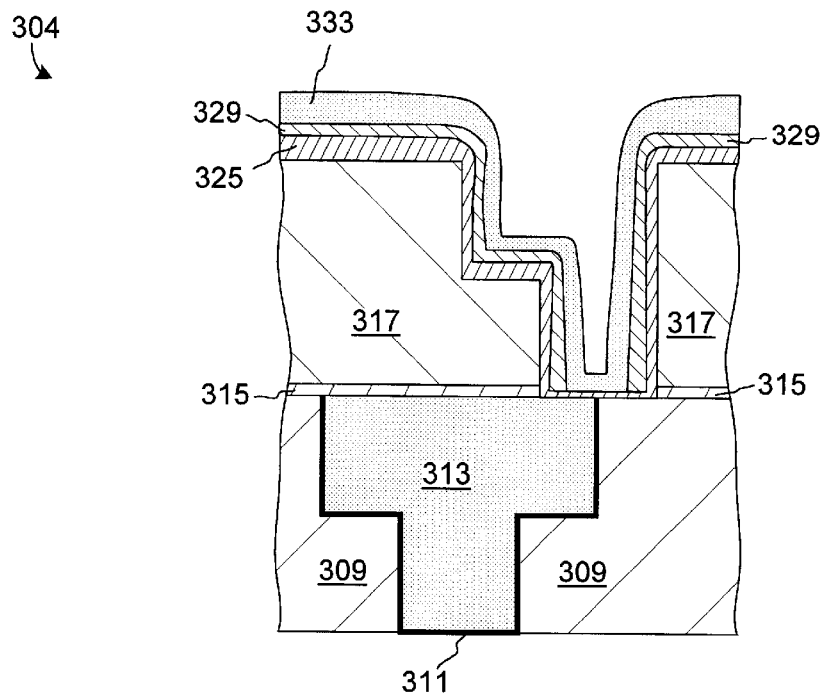
FIG. 3F is a cross-sectional depiction of a portion of a partially fabricated integrated circuit of the invention that is made using a process flow similar to that described for FIGS. 3B–E.

FIG. 3F, depicts the resulting structure 304 obtained (after seed layer deposition) using such an E/D scenario. Structure 304 is similar to structure 302 (depicted in FIG. 3E), except that a diffusion barrier is formed in which first portion 325 is continuous over the surface of the wafer and second portion 329 covers all of first portion 325 except at the bottom of the via. As second portion 329 was deposited, first portion 325 was partially etched at the via bottom. Thus, E/D in the trench and on the field was less than one, while at the bottom of the via, E/D was greater than one.

In another preferred method of the invention, the first portion of the diffusion barrier will be a bilayer, and once the second portion is deposited a trilayer will result. As in the methods for fully landed vias, if the first portion of the diffusion barrier is a bilayer, the bilayer will have a first deposited layer and a second deposited layer thereon. Either of the first or second deposited layers of the bilayer may include at least one of tantalum, nitrogen-doped tantalum, tantalum nitride, and titanium silicon nitride. These materials are preferably deposited as mentioned above.

Figure 3G:
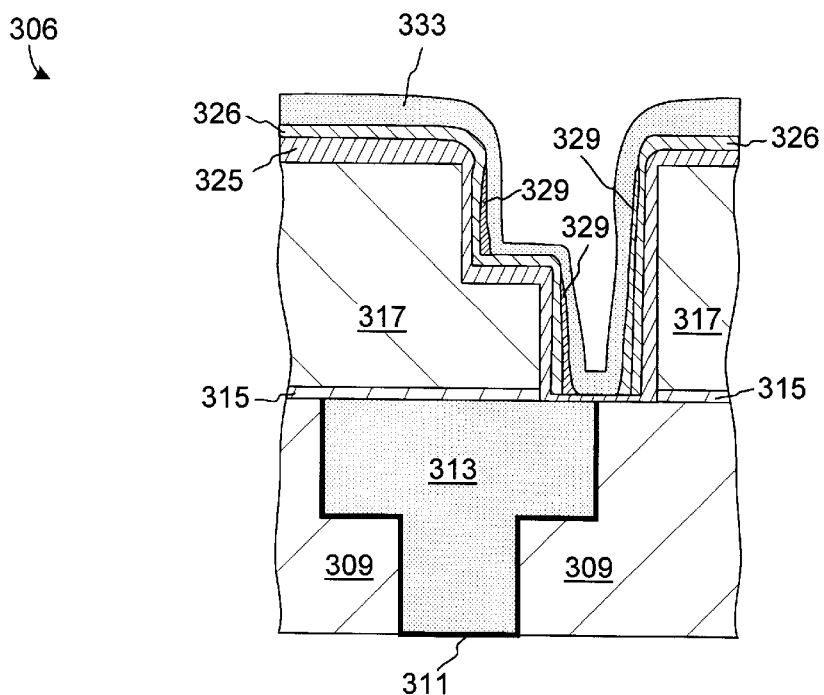
FIG. 3G is a cross-sectional depiction of a portion of another partially fabricated integrated circuit of the invention that is made using a process flow similar to that described for FIGS. 3B–E.

FIG. 3G depicts an example substrate 306, having such a trilayer diffusion barrier. In this case, a conformal layer 325 is deposited over the surface of the wafer, then another conformal layer 326 is deposited thereon. Once the bilayer (first portion) is deposited, then the second portion of the diffusion barrier is deposited using the simultaneous etch/deposition method. In this example, the second portion, 329, is deposited only on the side walls. At the same time, layer 326 is preferably etched through and layer 325 is etched only part way through at the bottom of the via. The resulting barrier layer is the trilayer structure depicted in FIG. 3G.

Alternatively, only layer 326 is etched wholly or partially, leaving layer 325 intact, resulting in a diffusion barrier having a minimum thickness at the bottom of the via. Also, alternatively, second portion 329 can be deposited on the trench and field horizontal surfaces as well as on the side walls.

SEED LAYERS OF THE INVENTION

Figure 4A:
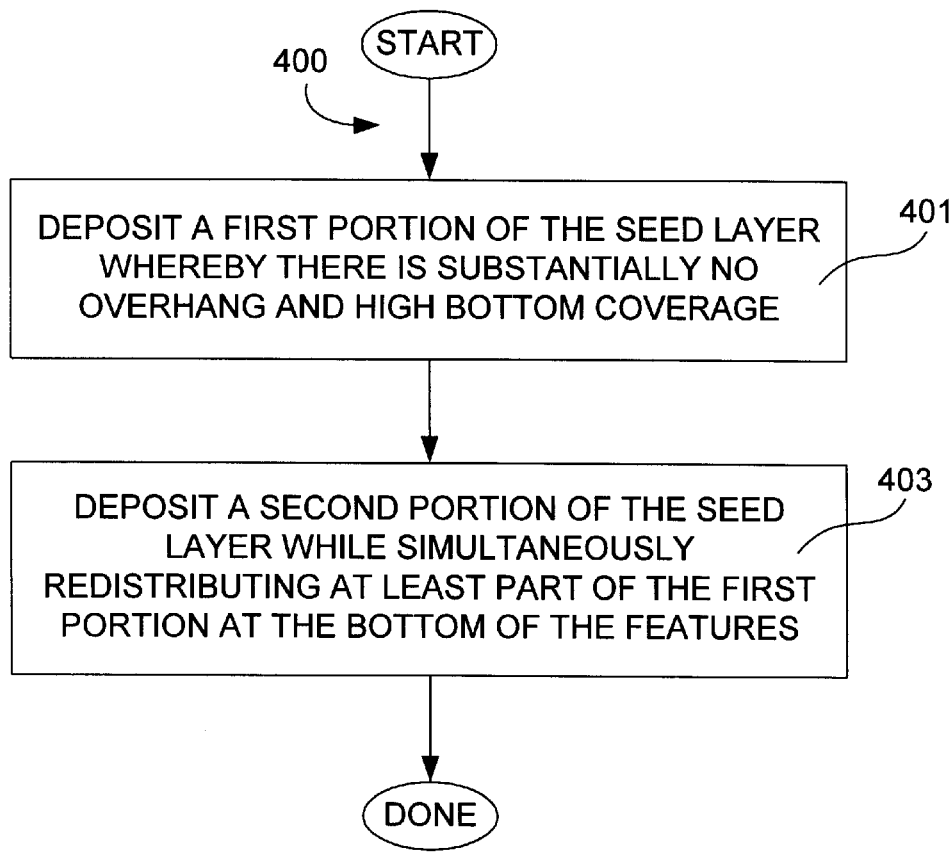
FIG. 4A is a flowchart that presents aspects of a method for forming seed layers of the invention.

As mentioned, other methods of the invention create seed layers for interconnect applications. Thus another aspect of the invention is a method for depositing a metal seed layer on a wafer substrate having a plurality of recessed device features. FIG. 4A is a flowchart showing aspects of a process flow, 400, in accordance with methods of the invention. A first portion of the metal seed layer is deposited on the wafer substrate. See 401. Preferably the first portion has substantially no overhang on the opening of each of the plurality of recessed device features. Also preferably the first portion of the metal seed layer includes bottom coverage in each of the plurality of recessed device features that is between about 20 and 100 percent as thick as that part of the first portion of the seed layer on the field of the wafer. Again, the bottom coverage depends upon the aspect ratio of the particular recessed device feature in which the seed layer is formed. Preferably for a recessed device feature having an aspect ratio of between about 3:1 and 4:1, the bottom coverage in (a) is between about 50 and 80 percent as thick as that part of the first portion of the seed layer on the field of the wafer substrate.

Figure 4B:
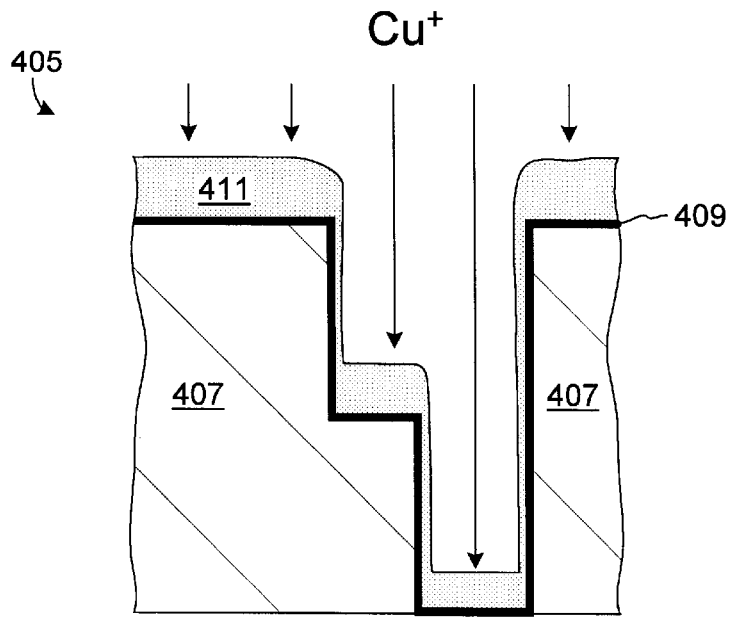
FIG. 4B is a cross sectional depiction of a recessed device feature after a first portion of a seed layer is deposited in accordance with the method described in relation to FIG. 4A.

FIG. 4B depicts a cross section, 405, of one such recessed device feature after the first portion of the seed layer is deposited. Dielectric layer 407 has a recessed feature etched into it (refer to FIGS. 1D–E description). A diffusion barrier, 409, is deposited over the surface of the wafer including the recessed feature. Then a first portion, 411, of a metal seed layer is deposited thereon using a first plasma. As mentioned, preferably, depositing the first portion of the metal seed layer on the wafer substrate is performed using a first plasma including a plurality of metal ions, the plurality of metal ions (e.g. copper ions) impinging on the wafer substrate substantially perpendicular to the wafer substrate work surface. The metal flux is highly ionized, but the ions have relatively low kinetic energy (high source power used and optionally an RF bias), and the metal is deposited substantially uni-directionally (as depicted in FIG. 4B) as described so that overhang is not created due to re-sputter of metal. In this way, the horizontal surfaces have much more coverage than the vertical surfaces (sidewalls), but there is little if any overhang (refer to FIG. 1G) on the opening of the recessed feature. Preferably the first portion is between about 300 Å and 1500 Å thick on the wafer substrate field and the horizontal surfaces of each of the plurality of recessed device features, more preferably about 800 Å thick.

Preferably the first plasma is produced at a pressure of between about 1 and 30 mTorr, more preferably at about 20 mTorr. Preferably the source power used to generate the first plasma is between about 15 and 50 kW, more preferably about 36 kW. Preferably the wafer substrate is held at a temperature of between about −100° C. and 50° C., more preferably about 0° C. during seed layer formation as described above. An RF frequency is optionally applied during deposition of the first portion of the seed layer. If applied, preferably the RF frequency is between about 100 kHz and 50 MHz, more preferably about 13.56 MHz. Preferably an RF power of between about 0 and 300 W is applied, more preferably about 300 W. Preferably, the ratio of the RF power to the DC (source) power is between about 0 and 20:1 W/kW, more preferably about 8:1 W/kW. Again, by keeping the ratio of RF power to the DC (source) power in this range, re-sputter during (a) is inhibited.

In a particularly preferred embodiment, the first plasma is subjected to a first downstream magnetic field prior to impinging on the wafer, the first magnetic field having a field strength of between about 36 and 1080 amp-turn, more preferably about 180 amp-turn. An amp-turn is ampere (current unit) multiplied by turns (how many turns used for coils made by copper wires). The INOVA source is characterized by an HCM target with a magnetic array around it to generate plasma within the target. There are also electromagnets (e.g. around anode shield 137, as depicted in FIG. 1I) used to modulate the plasma flux. The magnetic field created by such electromagnetic coils can provide high-density plasma (on the order of $10^{12}$–$10^{13}$ ions/cm3). For the INOVA apparatus, described in relation to FIG. 1I, the amperage values cited above correspond to an m-coil setting of preferably between about 0.1 and 3 Amp, more preferably about 0.5 Amp. Even more preferably the first plasma is subjected to a second downstream magnetic field prior to impinging on the wafer, the second magnetic field having a field strength of between about 130 and 3960 amp-turn, more preferably about 830 amp-turn. For the INOVA apparatus, described in relation to FIG. 1I, this corresponds to a d-coil setting of preferably between about 0.1 and 3 Amp, more preferably about 0.63 Amp.

Referring again to FIG. 4A, after the first portion of the seed layer is deposited, a second portion of the metal seed layer is deposited. Simultaneously, at least part of the first portion on the bottom of each of the plurality of recessed device features is redistributed from the bottom to the corresponding sidewalls of each of the plurality of recessed features. See 403. As mentioned, preferably the metal seed layer includes copper. The first and second portions may be copper, copper alloys, or other metals such as gold, silver and the like. For example, the first and second portions of the seed layer may be comprised of different metals altogether.

Figure 4C:
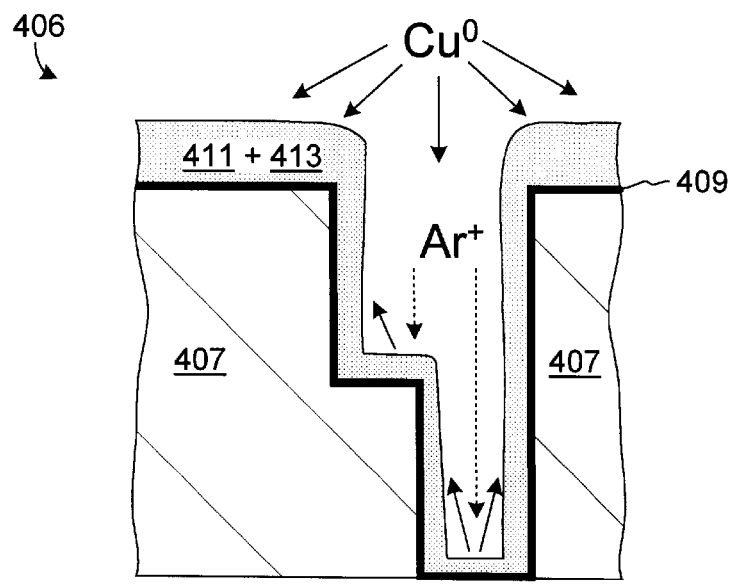
FIG. 4C is a cross sectional depiction of a recessed device feature after a second portion of a seed layer is deposited in accordance with the method described in relation to FIG. 4A.

FIG. 4C depicts a cross section, 406, of the recessed device feature depicted after the second portion of the seed layer is deposited and at least part of the first portion at the bottom of the feature is redistributed to the sidewalls. As mentioned, this is performed using a second plasma. Preferably the second plasma includes a plurality of metal atoms and a plurality of inert gas ions. As depicted in FIG. 4C, the plurality of metal atoms (in this example, copper atoms) impinging on the wafer substrate at substantially random angles and the plurality of inert gas ions (in this case argon ions) impinging on the wafer substrate substantially perpendicular to the wafer substrate work surface. That is, preferably the metal atoms are deposited at random angles, while the inert gas ions re-sputter some of the first portion from the bottom of the features to the sidewalls of the features. Thus the metal seed layer formed after the sequence, 401–403, includes first portion 411, and second portion 413. In this example, an RF bias applied to the wafer holder (for example) provide the directing effect for the argon ions to re-sputter material from the horizontal surfaces of the device feature. In this case, there are also copper atoms deposited, more at the field level than at the lower levels of the recessed device feature (see description of E/D ratio above). The re-sputtering element of the second deposition process provides a superior way to access difficult etch topography such as etch undercuts, bowed feature profiles, microtrenches, etc., because metal is sputtered from below the features as well as filled from varying angles from the copper atoms impinging from above the wafer work surface.

Preferably the second plasma is produced at a pressure of between about 1 and 30 mTorr, more preferably at about 20 mTorr. Preferably the source power used to generate the second plasma is between about 1 and 15 kW, more preferably about 9 kW. Preferably an RF frequency of between about 100 kHz and 50 MHz, more preferably about 13.56 MHz is applied to the wafer substrate during deposition of the second portion of the metal seed layer with simultaneous redistribution at least part of the first portion. Preferably an RF power of between about 100 and 500 W is applied, more preferably about 400 W. Preferably, the ratio of the RF power to the DC (source) power is between about 6.6:1 W/kW and 500:1 W/kW, more preferably about 45:1 W/kW. Again, by keeping the ratio of RF power to the DC (source) power in this range, re-sputter as described for (b) is achieved.

In a particularly preferred embodiment, the second plasma is subjected to a first downstream magnetic field prior to impinging on the wafer, the first magnetic field having a field strength of between about 36 and 1080 amp-turn, more preferably about 795 amp-turn. For the INOVA apparatus, described in relation to FIG. 1I, this corresponds to an m-coil setting of preferably between about 0.1 and 3 Amp, more preferably about 2.2 Amp. Even more preferably the second plasma is subjected to a second downstream magnetic field prior to impinging on the wafer, the second magnetic field having a field strength of between about 130 and 3960 amp-turn, more preferably about 1580 amp-turn. For the INOVA apparatus, described in relation to FIG. 1I, this corresponds to a d-coil setting of preferably between about 0 and 3 Amp, more preferably about 1.2 Amp.

Preferably, depositing the second portion of the metal seed layer while simultaneously redistributing at least part of the first portion ends before sputtering through the first portion at the bottom of the recessed features. Preferably, the thickness of the completed metal seed layer, at the bottom of each of the plurality of recessed device features is between about 25 Å and 500 Å thick, more preferably between about 50 Å and 100 Å thick. In one example, this endpoint is determined experimentally on a given structure and then the successful process repeated for wafers with similar structures and process demands.

Methods of the invention for forming seed layers such as depicted in FIG. 4C, where the sidewall coverage is enhanced (relative to the first portion, see FIG. 4B) by redistributing material from the horizontal surfaces of the wafer, including those surfaces within recessed device features. Since minimal overhang is created in the first step, 401, but rather the focus is to deposit onto the horizontal surfaces, the second step is used to redistribute material from the horizontal surfaces to the sidewalls. Deposition of seed material in the second step generally decreases with the depth of the feature. That is, although there is some material deposited in the second step, both on the horizontal surfaces and on the sidewalls, at the bottom of the features material is primarily redistributed to the sidewalls (i.e. the E/D ratio at the bottom of the features is>1).

EXPERIMENTAL

DIFFUSION BARRIERS

As mentioned, methods of the invention employ a simultaneous etch/deposition to etch barrier material at the via bottom while depositing barrier material elsewhere on a wafer substrate. As well, various aspects of process flows involve deposition of barrier materials (either by CVD or PVD), precleaning, and degassing operations. In certain preferred embodiments all these process steps are done in the same processing tool. One tool that allows degas, preclean, CVD deposition, and PVD deposition all under the same vacuum is the INOVA Tool available from Novellus Systems of San Jose, Calif. Therefore, once a wafer is in the tool and a vacuum is established, at least in some embodiments, all of the above described process aspects are performed without breaking vacuum. Only sources are changed during the operation, e.g. changing from a CVD source to a PVD source. For example, a wafer is placed into the apparatus, it is degassed, precleaned (for example with an argon plasma), a first deposited layer of barrier material is applied via CVD (e.g. titanium silicon nitride), a second deposited layer is applied via PVD (e.g. tantalum nitride). The first and second deposited layers make the first portion of the diffusion barrier. Finally, a tantalum etch/deposition process is carried out which deposits the second portion of the diffusion barrier and etches at least the bottom of the via, forming the final diffusion barrier structure.

Preferably the simultaneous etch/deposition is carried out using hollow-cathode magnetron (HCM) sputtering. Such devices are described in US Pat. Nos., 5,482,611, naming Helmer et al. as inventors, 6,179,973 B1 and 6,193, 854 B1, naming Lai et al. as inventors, and 6,217,716 B1 naming Lai as the inventor. If the barrier material to be deposited is tantalum, a tantalum target source is used.

Preferable process conditions for processing include a pressure of between about 0.1 and 100 mTorr. Argon flows are between about 50 and 300 SCCM (standard cubic centimeters per minute). When E/D>1 is desired both at the bottom of the vias and in the field, a DC source power of between about 1 and 10 kW (low power embodiments) is applied to the tantalum target. When an E/D>1 is desired at the bottom of the vias, but E/D<1 in the field is desired, a DC source power of between about 10 and 30kW (high power embodiments) is applied to the tantalum target. The m-coil (electromagnetic coil for controlling field shape and thus plasma flux) current used is between about 0.1–2.0 A, preferably about 1 A. The wafer temperature is manipulated using a temperature controlled stage, the wafer temperatures used are between about −100 and 100° C., preferably about −50° C. The wafer is biased with an RF frequency source (located below or in proximity to the stage). For methods where it is intended to etch through vias, the RF frequency is preferably between about 100 kHz and 50 MHz. For methods where it is intended to etch only part way through vias, the RF frequency is preferably between about 100 kHz and 50 MHz. The RF power applied is preferably between about 100 and 500 W. In preferred embodiments, the amount of sputtering is controlled by the RF power at fixed RF frequency. Various RF frequencies can be used to achieve this effect. One preferred RF frequency is 13.56 MHz.

In general, etch rate is most strongly related to the RF power, while the deposition rate is most strongly related to the DC source power. The E/D ratio depends predominantly on the ratio of RF power (table) to DC power (source). Generally, the higher the RF/DC power ratio, the higher the E/D ratio on the wafer. The etch rate is largely dependent on RF power and pressure since these parameters control the energy of Ar ions near the wafer. The deposition rate is largely dependent on DC power since this parameter affects the flux and energy of Ar ions near the surface target.

While not wishing to be bound by theory, it is believed that the RF frequency creates anisotropic plasma conditions. The etch/deposition ratio (E/D) can be controlled so that it is>1 in the via bottom and (resulting in a net etching), and≧1 or<1 on the trench and field horizontal surfaces. The magnitude of E/D on the side walls is<<1 because the plasma flux is directed primarily toward the wafer surface (parallel with the side walls). Thus, only horizontal surfaces (with relatively large surface areas (compared to the sidewalls)) are effectively etched by the impinging plasma flux. The sidewalls receive a net deposition.

If tantalum nitride or nitrogen-doped tantalum is the barrier material to be deposited, a nitrogen source such as $N_2$ will be used at 10–100 SCCM, preferably about 30 SCCM in conjunction with argon. Titanium silicon nitride is deposited by CVD using a technique described in U.S. patent application Ser. No. 09/965,471, entitled "Method of Depositing a Diffusion Barrier for Copper Interconnection Applications" (Atty. Dckt. NOVLP017) filed by Suwwan de Felipe filed on Sep. 26, 2001, or U.S. patent application 09/862,539, entitled "Improved Deposition of Conformal Copper Seed Layers by Control of Barrier Layer Morphology" (Attorney Docket No. NOVLP008) filed by Suwwan de Felipe on May 21, 2001.

As mentioned, methods of the invention form diffusion barriers having stacked structures. Both methods primarily intended for fully landed vias (etch through at via bottom) and methods primarily intended for unlanded vias (partial etch at via bottom) form bilayered and trilayered diffusion barriers. Illustrative structures of diffusion barriers of the invention were described above with reference to the figures. The table below summarizes further aspects of some preferred embodiments of the invention. Each of the twelve listed diffusion barriers may vary according to the particular thickness of the deposited layers, and whether or not material is deposited only on the side walls or on the side walls and the field and horizontal trench regions during the simultaneous etch deposition (E/D) process step. Therefore this table is meant to emphasize some preferred stack compositions as well as particular methods used to form them. The symbol "Ta(N)" is meant to designate tantalum with some nitrogen content. This can be nitrogen-doped tantalum, solid solutions interstitial forms) of tantalum and nitrogen, or tantalum nitrides. Titanium silicon nitride is designated by "TiN(Si)."

TABLE

Preferred Diffusion Barriers of the Invention

| Diffusion Barrier | Preclean | Barrier Material 1 | Barrier Material 2 | Barrier Material 3 |
|---|---|---|---|---|
| 1 | no | HCM Ta(N) | Ta E/D etch through | — |
| 2 | no | CVD TiN(Si) | Ta E/D etch through | — |
| 3 | yes | HCM Ta(N) | Ta E/D etch partial | — |
| 4 | yes | HCM Ta(N) | Ta E/D etch through | — |
| 5 | no | HCM Ta(N) | CVD TiN(Si) | Ta E/D etch through |
| 6 | yes | HCM Ta(N) | CVD TiN(Si) | Ta E/D etch partial |
| 7 | yes | HCM Ta(N) | CVD TiN(Si) | Ta E/D etch through |
| 8 | no | CVD TiN(Si) | HCM Ta(N) | Ta E/D etch through |
| 9 | yes | CVD TiN(Si) | HCM Ta(N) | Ta E/D etch partial |
| 10 | yes | CVD TiN(Si) | HCM Ta(N) | Ta E/D etch through |
| 11 | yes | CVD TiN(Si) | Ta E/D etch through | — |
| 12 | yes | CVD TiN(Si) | Ta E/D etch partial | — |

SEED LAYERS

Figure 5:
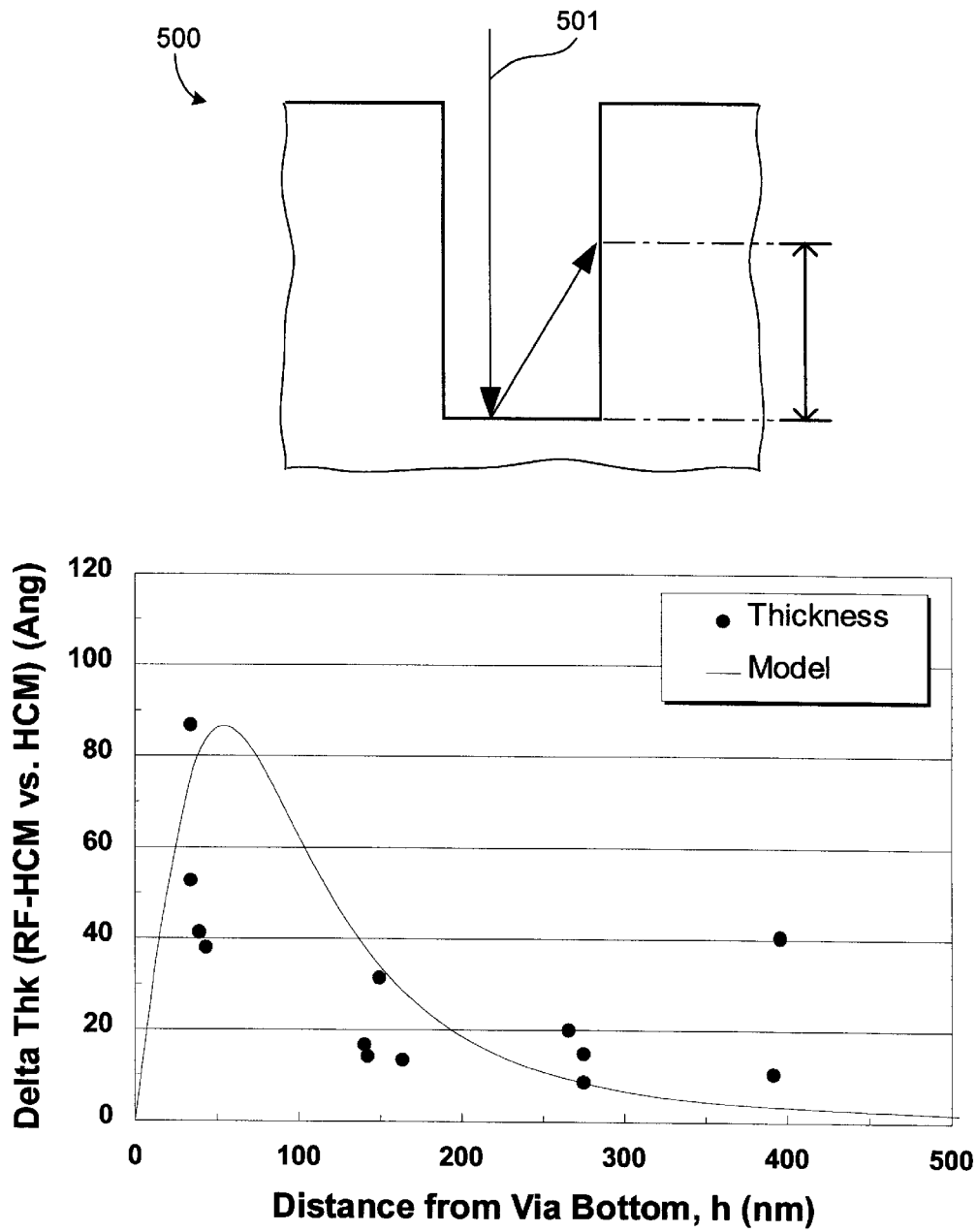
FIG. 5 is a graph depicting the change in thickness of a seed layer as a function of distance from the bottom of a recessed device feature, along with a schematic relating to the data presented.

A 700 Å (as measured on the field) first portion of a copper seed was deposited as described in relation to FIG. 4A on a wafer having recessed device features with a 3:1 aspect ratio (0.18 µm CD (critical dimension, aperture width) 0.13 µm technology node). FIG. 5 depicts a graph of the change in thickness of the first portion of the seed on the sidewalls of the feature as a function of height, h, from the bottom of the feature when re-sputtered That is, as the second portion of the seed is deposited and part of the first portion at the bottom is redistributed onto the sidewalls, the thickness of the sidewall seed changes. In this case, 150 Å of the seed was etched, as measured at the field. It is noteworthy to mention that although 150 Å of the first portion of the seed is etched from the field, there is also simultaneous deposition in the second operation, therefore the final thickness of the field typically exhibits a net loss of only about 50 Å of material in the final seed layer (after (a) and (b) as described above, see also FIG. 6).

Schematic, 500, above the graph in FIG. 5 depicts a theoretical trajectory, 501, of an argon ion hitting the bottom part of the first portion of the seed and imparting its energy to a copper atom which is redistributed to the sidewall at a height, h. Referring to the graph in FIG. 5, the line shows the theoretical distribution of material re-sputtered from the bottom of a feature with the above-described dimensions. The data points on the graph show actual measurements (measured by TEM analysis) of the change in thickness of the seed on the sidewalls as a function of height. The correlation shows that material is effectively re-distributed to the sidewalls using methods of the invention. The change in thickness from h=0 to about 200 nm is due primarily to re-sputter of bottom material. The change in thickness from about h=200 to about 300 nm is due to the re-sputter and the low power deposition. Finally, the change in thickness from about h=300 to about 500 nm and above is primarily due to the low power deposition. That is, under the conditions of these experiments, the re-sputter does not redistribute material from the bottom of the feature much past 300 nm in height.

Figure 6:
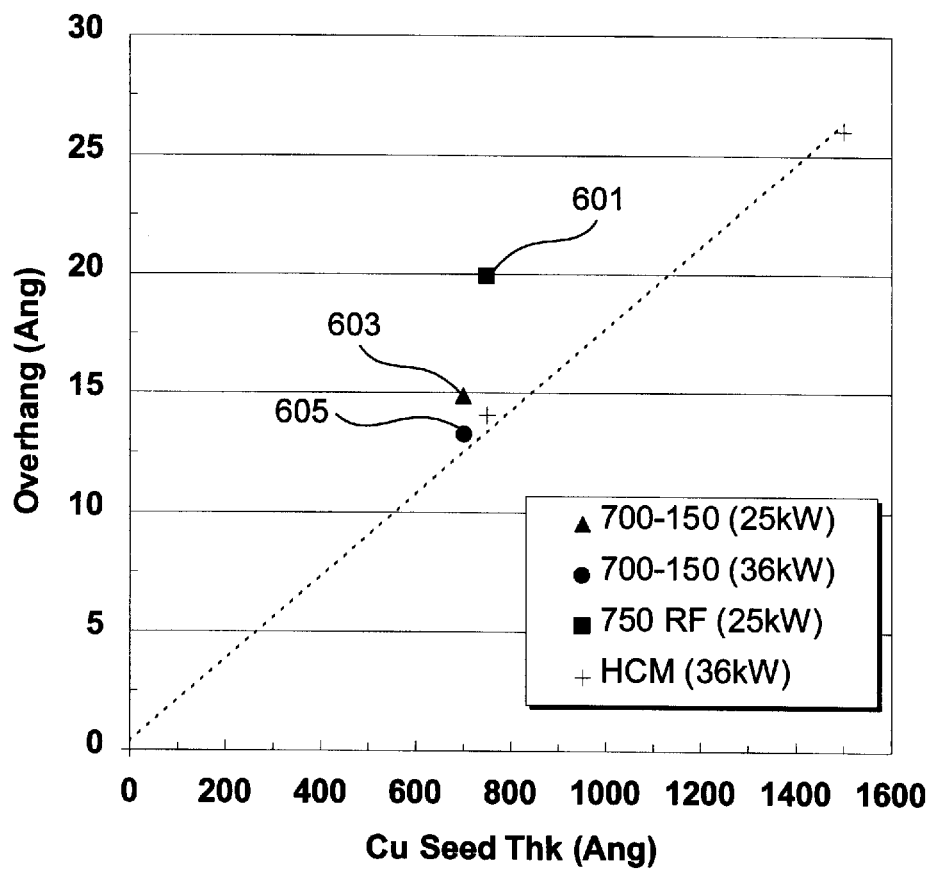
FIG. 6 is a graph depicting the amount of seed layer overhang associated with a recessed device feature in relation to conventional sputter methods and the invention.

FIG. 6 shows a graph of the amount of overhang, associated with a feature of the approximate dimensions as described in relation to FIG. 5, versus seed thickness, in relation to various methods. Again, a 700 Å (as measured on the field) first portion was deposited, followed by a 150 Å re-sputter (as measured on the field) during deposition of a second portion. The dotted line represents a baseline amount of overhang created from a standard HCM sputter process. Point 601 shows the amount of overhang when a high RF bias (low power) is used in a first deposition step (such as described Iacoponi et al. (U.S. Pat. No. 6,228,754)). Points 603 and 605 show the amount of overhang created when methods of the invention are used, at various power values. In this case, the amount of overhang created is significantly less than that of the prior art. This is an unexpected result. That is, by depositing material in the first step with an RF power to DC power ratio as described above, material can be deposited on the horizontal surfaces to sufficient thickness so that a fraction of the bottom portion can be subsequently re-sputtered, while only minimal amounts of overhang (if any) are created. Relative to conventional methods, the invention provides reduction of the minimum required seed thickness (due to re-distribution onto sidewalls), as well as improved fill for difficult etch topography. By using relatively high pressures, methods of the invention also provide less heat load than conventional methods, i.e. the heat load is suppressed by the process pressures. For these reasons, the% invention is particularly useful for low-k material applications.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for depositing a metal seed layer on a wafer substrate comprising a plurality of recessed device features, the method comprising:
   (a) depositing a first portion of the metal seed layer on the wafer substrate, wherein said first portion comprises substantially no overhang on the opening of each of the plurality of recessed device features and said first portion comprises bottom coverage in each of said plurality of recessed device features that is between about 20 and 100 percent as thick as that part of the first portion of the seed layer on the field of the wafer substrate, wherein the first portion is deposited without substantial re-sputtering; and
   (b) depositing a second portion of the metal seed layer while simultaneously redistributing at least part of the first portion on the bottom of each of the plurality of recessed device features from the bottom to the corresponding sidewalls of each of the plurality of recessed features.

2. The method of claim 1, wherein the metal seed layer comprises copper.

3. The method of claim 1, wherein (a) is performed using a first plasma comprising a plurality of metal ions, said plurality of metal ions impinging on the wafer substrate substantially perpendicular to the wafer substrate work surface.

4. The method of claim 3, wherein the first plasma is produced at a pressure of between about 1 and 30 mTorr.

5. The method of claim 3, wherein the first plasma is produced at a pressure of about 20 mTorr.

6. The method of claim 3, wherein a source power of between about 15 and 50 kW is used to generate the first plasma.

7. The method of claim 6, wherein the source power used to generate the first plasma is about 36 kW.

8. The method of claim 3, wherein the wafer substrate is held at a temperature of between about −100° C. and 50° C. during (a) and (b).

9. The method of claim 3, wherein the wafer substrate is held at a temperature of about 0° C. during (a) and (b).

10. The method of claim 3, wherein an RF frequency of between about 100 kHz and 50 MHz is applied to the wafer substrate during (a).

11. The method of claim 10, wherein the RF frequency is about 13.56 MHz.

12. The method of claim 10, wherein an RF power of between about 0 and 300 W is applied.

13. The method of claim 11, wherein an RF power of about 300 W is applied.

14. The method of claim 1, wherein the first portion is between about 300 Å and 1500 Å thick on the wafer substrate field and the horizontal surfaces of each of the plurality of recessed device features.

15. The method of claim 1, wherein the first portion is about 800 Å thick on the wafer substrate field.

16. The method of claim 3, wherein the first plasma is subjected to a first downstream magnetic field prior to impinging on the wafer, said first magnetic field comprising a field strength of between about 36 and 1080 amp-turn.

17. The method of claim 16, wherein said first magnetic field comprises a field strength of about 180 amp-turn.

18. The method of claim 16, wherein the first plasma is subjected to a second downstream magnetic field prior to impinging on the wafer, said second magnetic field comprising a field strength of between about 130 and 3960 amp-turn.

19. The method of claim 18, wherein said second magnetic field comprises a field strength of about 830 amp-turn.

20. The method of claim 3, wherein a ratio of RF power to DC (source power) used to create the first plasma is between about 0 and 20:1 W/kW.

21. The method of claim 20, wherein the ratio of RF power to DC (source power) is about 8:1 W/kW.

22. The method of claim 1, wherein (b) is performed using a second plasma comprising a plurality of metal atoms and a plurality of inert gas ions, said plurality of metal atoms impinging on the wafer substrate at substantially random angles and said plurality of inert gas ions impinging on the wafer substrate substantially perpendicular to the wafer substrate work surface.

23. The method of claim 22, wherein the second plasma is produced at a pressure of between about 1 and 30 mTorr.

24. The method of claim 22, wherein the second plasma is produced at a pressure of about 20 mTorr.

25. The method of claim 22, wherein a source power of between about 1 and 15 kW is used to generate the second plasma.

26. The method of claim 25, wherein the source power is about 9 kW.

27. The method of claim 22, wherein an RF frequency of between about 100 kHz and 50 MHz is applied to the wafer substrate during (b).

28. The method of claim 27, wherein the RF frequency is about 13.56 MHz.

29. The method of claim 27, wherein an RF power of between about 100 and 500 W is applied.

30. The method of claim 28, wherein an RF power of about 400 W is applied.

31. The method of claim 22, wherein a ratio of RF power to DC (source power) used to create the second plasma is between about 6.6:1 and 500:1 W/kW.

32. The method of claim 31, wherein the ratio of RF power to DC (source power) is about 45:1 W/kW.

33. The method of claim 22, wherein the second plasma is subjected to a first downstream magnetic field prior to impinging on the wafer, said first magnetic field comprising a field strength of between about 36 and 1080 amp-turn.

34. The method of claim 33, wherein said first magnetic field comprises a field strength of about 795 amp-turn.

35. The method of claim 33, wherein the second plasma is subjected to a second downstream magnetic field prior to impinging on the wafer, said second magnetic field comprising a field strength of between about 130 and 3960 amp-turn.

36. The method of claim 33, wherein said second magnetic field comprises a field strength of about 1580 amp-turn.

37. The method of claim 1, wherein the thickness of the metal seed layer, at the bottom of each of the plurality of recessed device features, after (a) and (b) is between about 25 Å and 500 Å thick.

38. The method of claim 1, wherein the thickness of the metal seed layer, at the bottom of each of the plurality of recessed device features, after (a) and (b) is between about 50 Å and 100 Å thick.

39. The method of claim 1, wherein said first portion comprises bottom coverage in each of said plurality of recessed device features that is between about 50 and 80 percent as thick as that part of the first portion of the seed layer on the field of the wafer for each of the plurality of recessed device features having an aspect ratio of between about 3:1 and 4:1.

40. A method for depositing a metal seed layer on a wafer substrate comprising a plurality of recessed device features, the method comprising:

(a) depositing a first portion of the metal seed layer on the wafer substrate via plasma deposition, wherein:

the first portion includes bottom coverage in each of the plurality of recessed device features that is between about 20 and 100 percent as thick as part of the first portion of the seed layer on the field of the wafer substrate;

the first portion is deposited using metal ions generated in a plasma; and the first portion is deposited using a first ratio of wafer substrate RF bias to DC source power that is low enough to inhibit re-sputtering; and (b) after depositing the first portion of the metal seed layer, depositing a second portion of the metal seed layer while simultaneously redistributing at least part of the first portion on the bottom of each of the plurality of recessed device features to the corresponding sidewalls of each of the plurality of recessed features, wherein:

the second portion is deposited using a second ratio of wafer substrate RF bias to DC source power that is higher than the first ratio of wafer substrate RF bias to DC source power such that re-sputtering is not inhibited.

* * * * *